US010080293B2

(12) United States Patent
Sato et al.

(10) Patent No.: US 10,080,293 B2
(45) Date of Patent: Sep. 18, 2018

(54) ELECTRONIC COMPONENT-EMBEDDED BOARD AND ELECTRONIC COMPONENT DEVICE

(71) Applicant: SHINKO ELECTRIC INDUSTRIES CO., LTD., Nagano-shi, Nagano (JP)

(72) Inventors: Junji Sato, Nagano (JP); Katsuya Fukase, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/658,532

(22) Filed: Jul. 25, 2017

(65) Prior Publication Data

US 2018/0042115 A1 Feb. 8, 2018

(30) Foreign Application Priority Data

Aug. 5, 2016 (JP) .................. 2016-154426

(51) Int. Cl.
*H05K 1/16* (2006.01)
*H05K 1/18* (2006.01)
(Continued)

(52) U.S. Cl.
CPC ........... *H05K 1/186* (2013.01); *H01L 21/486* (2013.01); *H01L 21/4857* (2013.01); *H01L 21/6836* (2013.01); *H01L 23/13* (2013.01); *H01L 23/49816* (2013.01); *H01L 23/49822* (2013.01); *H01L 23/49827* (2013.01); *H01L 23/49838* (2013.01); *H01L 24/16* (2013.01); *H01L 2221/68345* (2013.01); *H01L 2221/68359* (2013.01); *H01L 2224/16227* (2013.01);
(Continued)

(58) Field of Classification Search
CPC ......... H05K 1/186; H05K 2201/10015; H05K 2201/10522; H05K 1/185; H05K 1/183; H05K 1/184
See application file for complete search history.

(56) References Cited

U.S. PATENT DOCUMENTS

2010/0103635 A1\* 4/2010 Tuominen ........... H01L 23/5389
361/764
2012/0287586 A1 11/2012 Mikado et al.
(Continued)

FOREIGN PATENT DOCUMENTS

JP 2002-043755 2/2002
JP 2007-258541 10/2007
(Continued)

*Primary Examiner* — Steven T Sawyer
(74) *Attorney, Agent, or Firm* — Rankin, Hill & Clark LLP

(57) ABSTRACT

An electronic component-embedded board includes: a core substrate; a cavity which penetrates the core substrate; a wiring layer formed on one face of the core substrate; a component mounting pattern formed of the same material as the wiring layer and laid across the cavity to partition the cavity into through holes in plan view; an electronic component mounted on the component mounting pattern and arranged inside the cavity; a first insulating layer formed on the one face of the core substrate to cover one face of the electronic component; and a second insulating layer formed on the other face of the core substrate to cover the other face of the electronic component. The cavity is filled with the first insulating layer and the second insulating layer.

11 Claims, 27 Drawing Sheets

(51) Int. Cl.
*H01L 23/13* (2006.01)
*H01L 23/498* (2006.01)
*H01L 21/683* (2006.01)
*H01L 21/48* (2006.01)
*H01L 23/00* (2006.01)

(52) U.S. Cl.
CPC ............... *H01L 2924/19041* (2013.01); *H01L 2924/19102* (2013.01); *H05K 2201/10015* (2013.01); *H05K 2201/10515* (2013.01); *H05K 2201/10522* (2013.01)

(56) References Cited

U.S. PATENT DOCUMENTS

| | | | |
|---|---|---|---|
| 2014/0144676 A1* | 5/2014 | Chung | ................... H05K 1/186 174/251 |
| 2014/0153205 A1 | 6/2014 | Mikado et al. | |
| 2016/0338195 A1* | 11/2016 | Ikeda | ................... H05K 1/0298 |

FOREIGN PATENT DOCUMENTS

| | | |
|---|---|---|
| JP | 2014-220366 | 11/2014 |
| WO | 2012/157426 | 11/2012 |

* cited by examiner

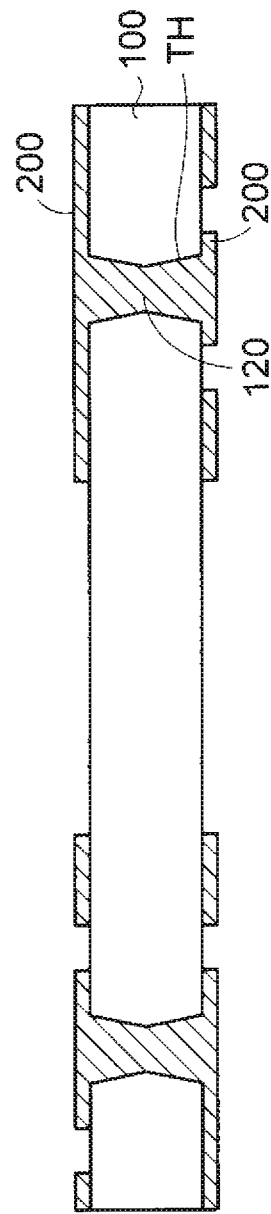
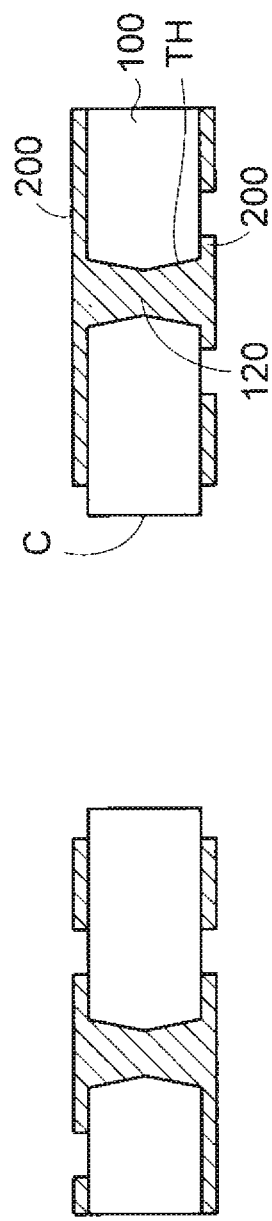
FIG. 1A
FIG. 1B

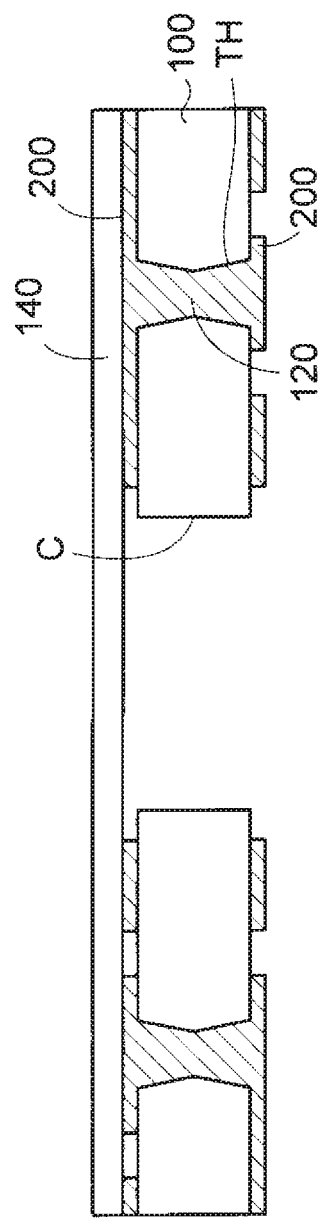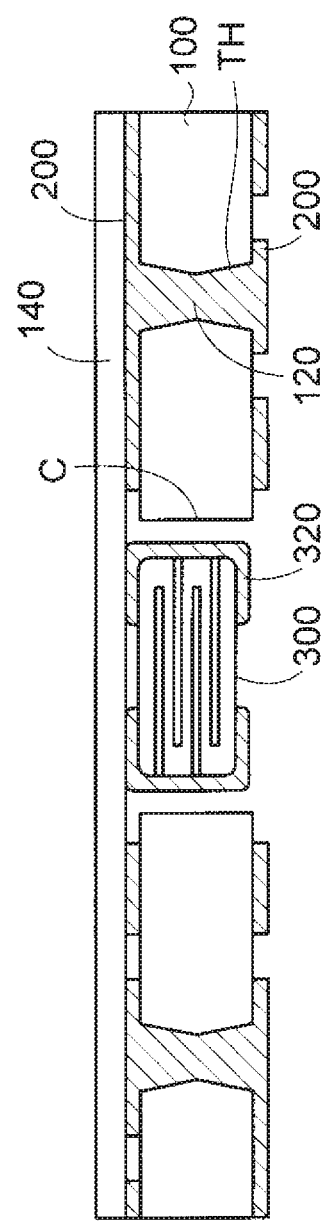

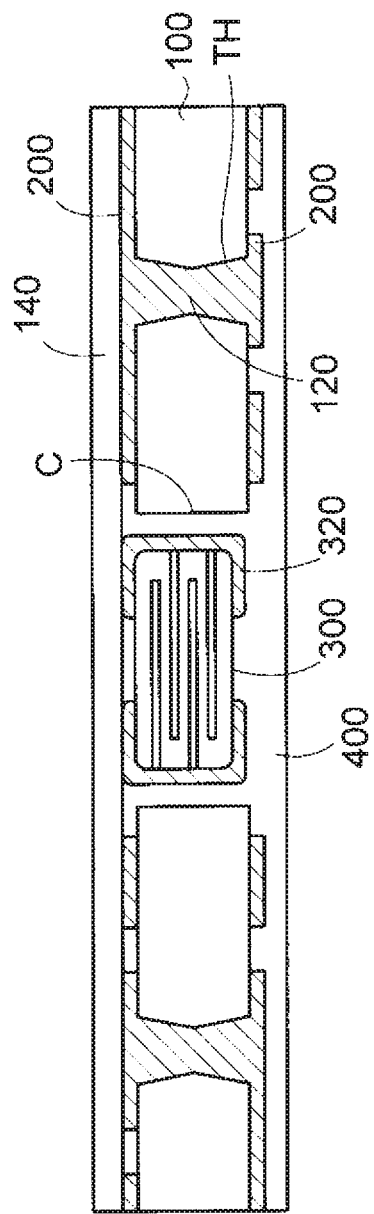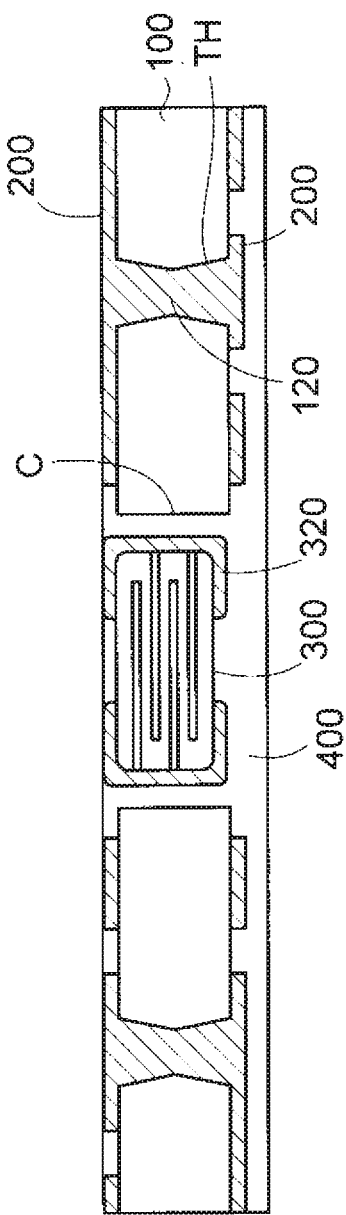

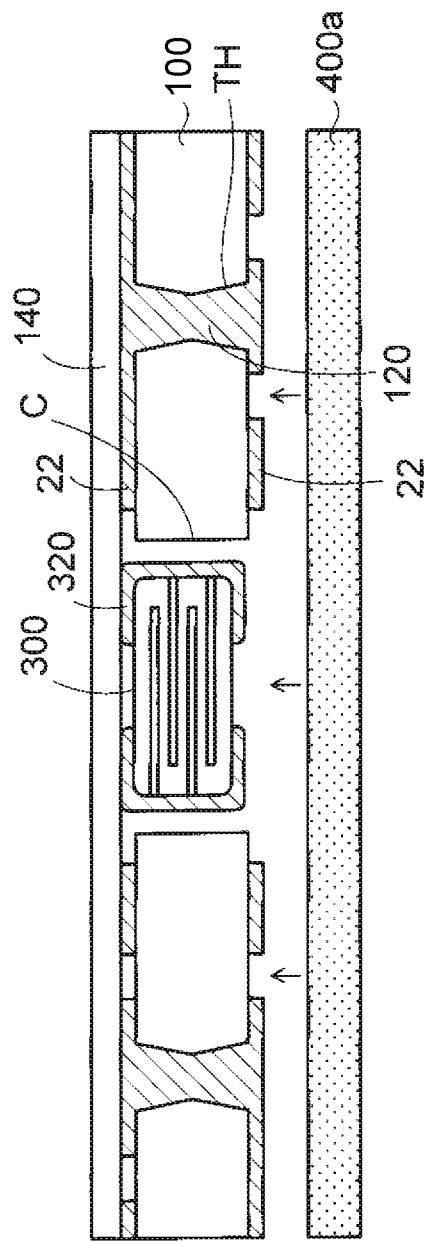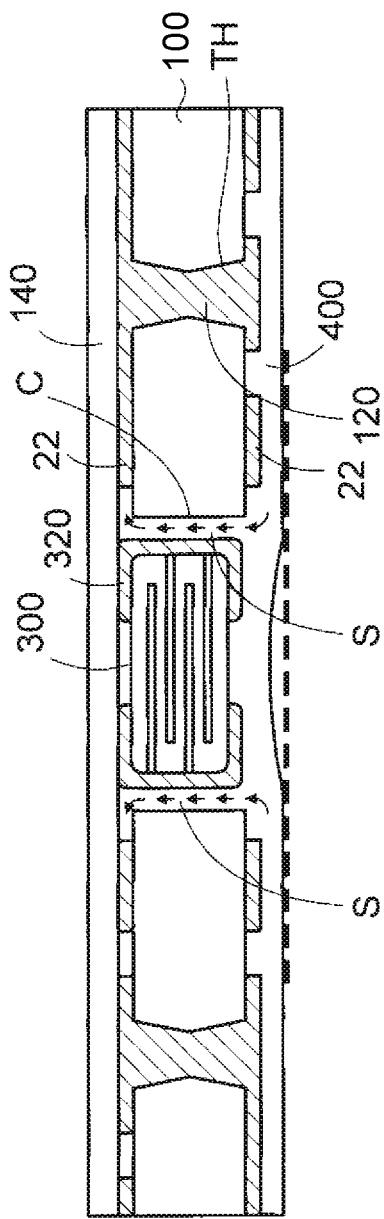
FIG. 6A
FIG. 6B

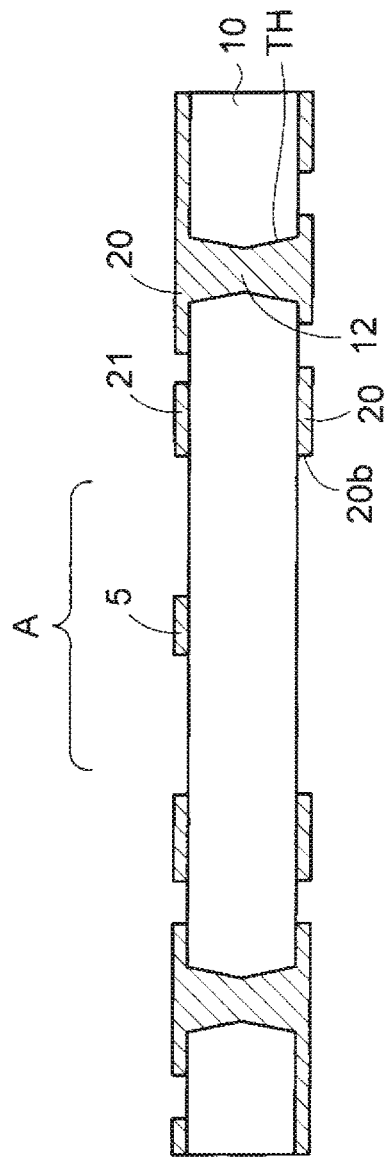
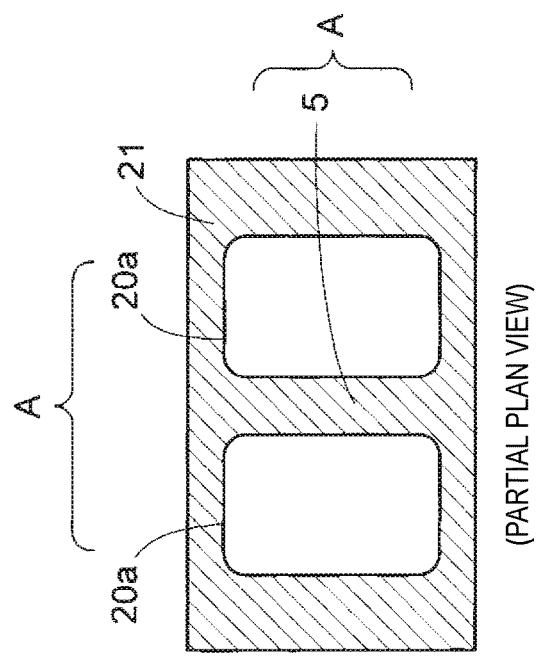
FIG. 8A
FIG. 8B (PARTIAL PLAN VIEW)

(COMPONENT MOUNTING PATTERN)

ELECTRONIC COMPONENT-EMBEDDED BOARD AND ELECTRONIC COMPONENT DEVICE

This application claims priority from Japanese Patent Application No. 2016-154426, filed on Aug. 5, 2016, the entire contents of which are herein incorporated by reference.

BACKGROUND

1. Technical Field

The present disclosure relates to an electronic component-embedded board and an electronic component device having the electronic component-embedded board.

2. Background Art

According to the background art, there are electronic component-embedded boards in which electronic components such as semiconductor chips or capacitors are embedded. In such an electronic component-embedded board, an electronic component is arranged in a cavity formed in a core substrate and wiring layers are connected to the electronic component (see e.g., JP-A-2002-43755, JP-A-2007-258541, JP-A-2014-220366, and WO 2012/157426).

As will be described in paragraphs about a preliminary matter (described later), in a manufacturing method for an electronic component-embedded board, first, a cavity is formed to penetrate a core substrate, and a temporary fixation tape is pasted on an upper face of the core substrate. Next, after a capacitor is adhesively bonded to the temporary fixation tape inside the cavity, a resin film is disposed on a lower face of the core substrate to thereby form a first insulating layer for sealing lower face of the capacitor.

Further, after the temporary fixation tape is released, another resin film is disposed on the upper face of the core substrate to thereby form a second insulating layer for sealing an upper face of the capacitor.

In such a manufacturing method, due to the temporary fixation tape which is used to mount the capacitor thereon, the step of sealing the capacitor with the resin has to be performed twice. Thus, the manufacturing process is complicated and the cost increases.

When the first insulating layer is formed, the resin flows into a space on one side of the capacitor. Therefore, a volume of the resin which can cover the lower face of the capacitor is reduced accordingly, and a recess of the first insulating layer is apt to occur at a lower region of the capacitor.

When a thickness of the capacitor is thinner than a thickness of the core substrate, the capacitor is arranged in a position deviated to an upper portion side of the cavity. Therefore, the first insulating layer on the lower side of the capacitor and the second insulating layer on the upper side of the capacitor are formed to have different thicknesses.

Accordingly, depths of via holes arranged on the upper and lower faces of the capacitor vary from each other. Therefore, there is a problem that satisfactory reliability of via connection cannot be obtained.

SUMMARY

According to one or more aspects of the present disclosure, there is provided an electronic component-embedded board.

The electronic component-embedded board comprises:
a core substrate;
a cavity which penetrates the core substrate;
a wiring layer formed on one face of the core substrate;
a component mounting pattern formed of the same material as the wiring layer and laid across the cavity to partition the cavity into through holes in plan view;
an electronic component mounted on the component mounting pattern and arranged inside the cavity;
a first insulating layer formed on the one face of the core substrate to cover one face of the electronic component; and
a second insulating layer formed on the other face of the core substrate to cover the other face of the electronic component,
wherein the cavity is filled with the first insulating layer and the second insulating layer.

According to one or more aspects of the present disclosure, there is provided an electronic component device.

The electronic component device comprises:
an electronic component-embedded board; and
a second electronic component on the electronic component-embedded board.

The electronic component-embedded board comprises:
a core substrate;
a cavity which penetrates the core substrate;
a wiring layer formed on one face of the core substrate;
a component mounting pattern formed of the same material as the wiring layer and laid across the cavity to partition the cavity into through holes in plan view;
a first electronic component mounted on the component mounting pattern and arranged inside the cavity;
a first insulating layer formed on the one face of the core substrate to cover one face of the first electronic component; and
a second insulating layer formed on the other face of the core substrate to cover the other face of the other electronic component,
wherein the cavity is filled with the first insulating layer and the second insulating layer, and
wherein the second electronic component is electrically connected to the first electronic component.

BRIEF DESCRIPTION OF DRAWINGS

FIGS. 1A and 1B are sectional views illustrating a manufacturing method for an electronic component-embedded board according to a preliminary matter (Part 1);

FIGS. 2A and 2B are sectional views illustrating the manufacturing method for the electronic component-embedded board according to the preliminary matter (Part 2);

FIGS. 3A and 3B are sectional views illustrating the manufacturing method for the electronic component-embedded board according to the preliminary matter (Part 3);

FIGS. 6A and 6B are sectional views illustrating a problem in the manufacturing method for the electronic component-embedded board according to the preliminary matter (Part 1);

FIGS. 8A and 8B are a sectional view and a partial plan view illustrating a manufacturing method for an electronic component-embedded board according to an embodiment (Part 1);

DETAILED DESCRIPTION

Figure 4A:
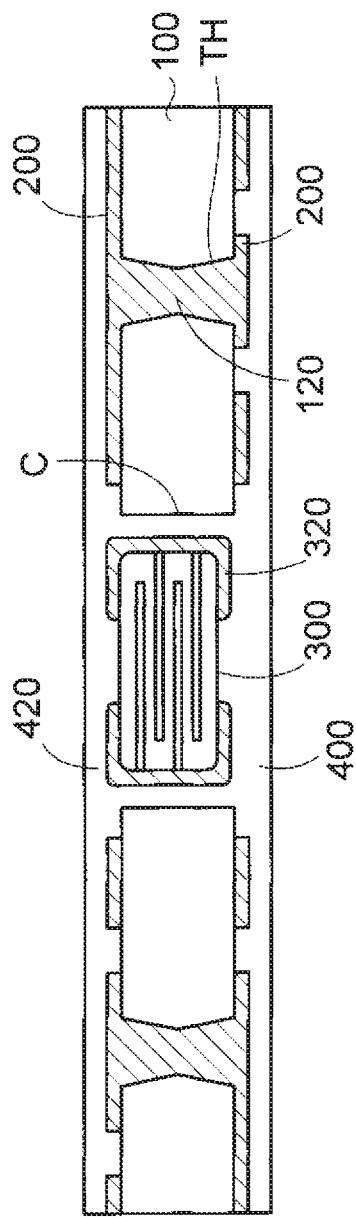
FIGS. 4A and 4B are sectional views illustrating the manufacturing method for the electronic component-embedded board according to the preliminary matter (Part 4)

An embodiment will be described below with reference to the accompanying drawings.

A preliminary matter underlying the embodiment will be described prior to description of the embodiment. Description of the preliminary matter is about the details of personal study of the present inventor, which contain novel techniques rather than known techniques.

FIGS. 1 to 7 are views for explaining a manufacturing method for an electronic component-embedded board according to the preliminary matter. In the electronic component-embedded board according to the preliminary matter, first, a core substrate 100 having a structure illustrated in FIG. 1A is prepared. First wiring layers 200 are formed on two faces of the core substrate 100 respectively. Through holes TH are formed in the core substrate 100. The first wiring layers 200 on the two face sides are connected to each other via through conductors 120 inside the through holes TH.

Next, as illustrated in FIG. 1B, a cavity C is formed to penetrate the core substrate 100 in a thickness direction. Successively, as illustrated in FIG. 2A, a temporary fixation tape 140 is pasted on the upper face of the core substrate 100.

Further, as illustrated in FIG. 2B, a capacitor 300 which has connection terminals 320 provided on its two end sides is prepared, and an upper face of the capacitor 300 is adhesively bonded to the temporary fixation tape 140 inside the cavity C of the core substrate 100. Next, as illustrated in FIG. 3A, a resin film is disposed on the lower face of the core substrate 100 to thereby form a first insulating layer 400. Thus, side faces and a lower face of the capacitor 300 are sealed with the first insulating layer 400.

Successively, as illustrated in FIG. 3B, the temporary fixation tape 140 is released from the core substrate 100 to thereby expose the upper face of the core substrate 100 and the upper face of the capacitor 300. Further, as illustrated in FIG. 4A, a resin film is disposed on the upper face of the core substrate 100 to thereby form a second insulating layer 420. Thus, the upper face of the capacitor 300 is sealed with the second insulating layer 420.

Figure 4B:
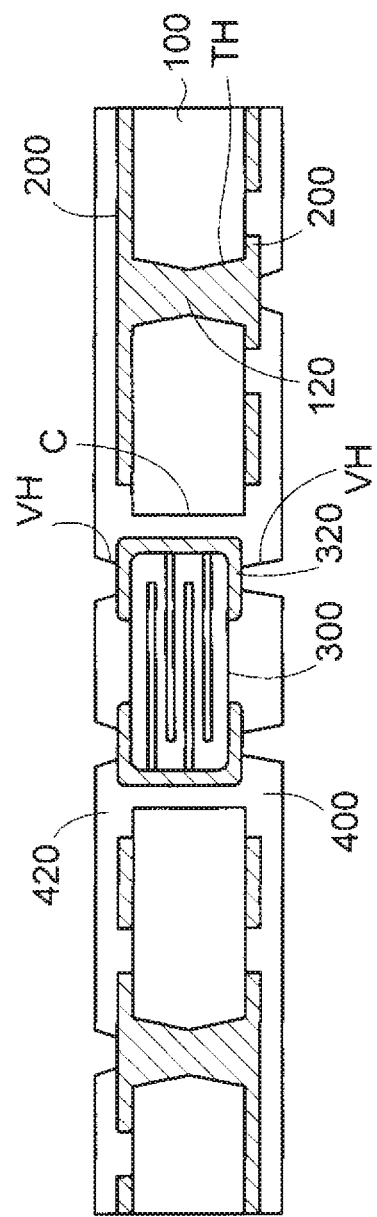

Successively, as illustrated in FIG. 4B, laser machining is applied to the first insulating layer 400 on the lower face side of the core substrate 100 to thereby form via holes VH reaching lower faces of the connection terminals 320 of the capacitor 300 and the first wiring layer 200.

Simultaneously, laser machining is applied to the second insulating layer 420 on the upper face side of the core substrate 100 to thereby form via holes VH reaching upper faces of the connection terminals 320 of the capacitor 300 and the first wiring layer 200.

Figure 5:
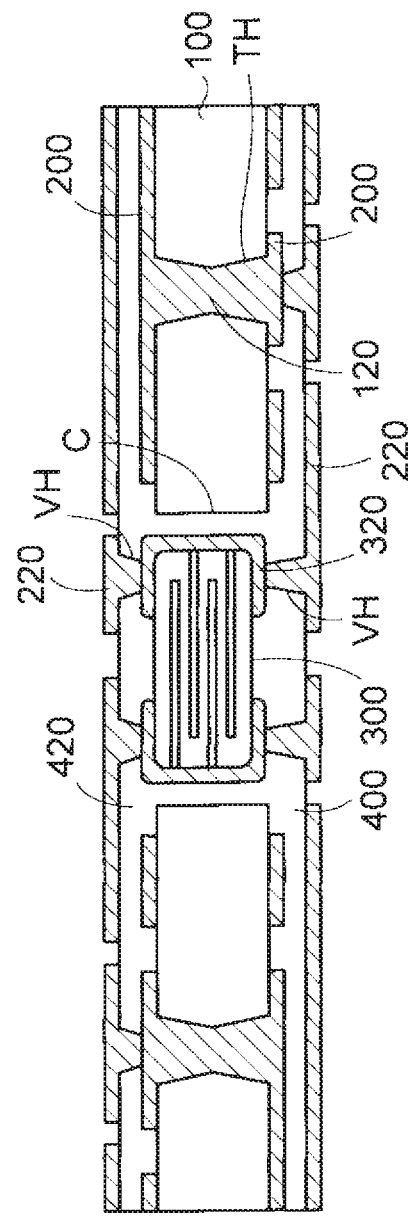
FIG. 5 is a sectional view illustrating the manufacturing method for the electronic component-embedded board according to the preliminary matter (Part 5)

Then, as illustrated in FIG. 5, second wiring layers 220 are formed respectively on the first insulating layer 400 and the second insulating layer 420. The second wiring layer 220 on the first insulating layer 400 is connected to the lower faces of the connection terminals 320 of the capacitor 300 and the first wiring layer 200 through the via holes VH.

Similarly, the second wiring layer 220 on the second insulating layer 420 is connected to the upper faces of the connection terminals 320 of the capacitor 300 and the first wiring layer 200 through the via holes VH.

Figure 7:
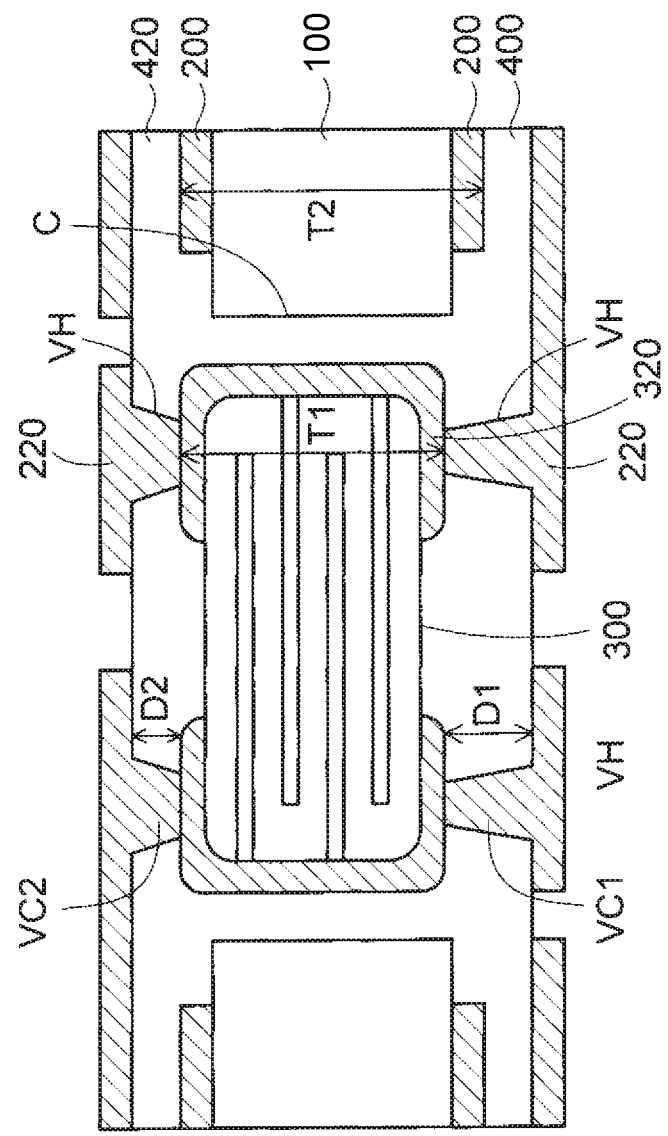
FIG. 7 is a sectional view illustrating another problem in the manufacturing method for the electronic component-embedded board according to the preliminary matter (Part 2)

FIGS. 6A and 6B and FIG. 7 are views for explaining problems in the aforementioned manufacturing method for the electronic component-embedded board.

A problem in the aforementioned step of FIG. 3A is illustrated in FIGS. 6A and 6B. As illustrated in FIG. 6A, the capacitor 300 is adhesively bonded to the temporary fixation tape 140 which has been arranged on an upper end side of the cavity C of the core substrate 100 in the aforementioned step of FIG. 3A.

An uncured resin film 400a is disposed on the lower face side of the core substrate 100 by hot press.

On this occasion, the lower face of the capacitor 300 is sealed with the resin while a space S between an inner wall of the cavity C of the core substrate 100 and the side faces of the capacitor 300 is filled with the resin, as illustrated in FIG. 6B.

Accordingly, the resin flows into the space S from the resin film 400a arranged on a lower region of the capacitor 300. Therefore, a volume of the resin which can cover the lower face of the capacitor 300 is reduced accordingly, and a recess of the first insulating layer 400 is apt to occur at the lower region of the capacitor 300.

When a thickness of the capacitor 300 is thinner than a thickness of the core substrate 100 including the first wiring layers 200 as illustrated in FIG. 6B, the capacitor 300 is mounted to sink inward from the lower face of the core substrate 100. Therefore, an amount of the recess of the first insulating layer 400 at the lower region of the capacitor 300 further increases. Consequently, flatness becomes a problem.

Thus, in the manufacturing method for the electronic component-embedded board according to the preliminary matter, the recess of the first insulating layer 400 is apt to occur at the lower region of the capacitor 300. Accordingly, depths of the vial holes VH connected to the connection terminals 320 of the capacitor 300 vary from one another unstably. Consequently, reliability of via connection between the capacitor 300 and each of the second wiring layers 220 cannot be obtained satisfactorily.

Further, there is a concern that a thickness of the first insulating layer 400 may be considerably thinner at the lower region of the capacitor 300. Accordingly, there is a fear that insulation properties between the capacitor 300 and the second wiring layer 220 on the lower side of the capacitor 300 may be a problem.

In addition, due to the temporary fixation tape 140 which is used to mount the capacitor 300 thereon, the step of sealing the capacitor 300 with the resin has to be performed twice. Thus, the manufacturing process is complicated and the cost increases.

A problem in the aforementioned structure around the capacitor 300 in FIG. 5 is illustrated in FIG. 7. In the aforementioned step of FIG. 2B, the capacitor 300 is mounted on the temporary fixation tape 140 which has been arranged on the upper end side of the cavity C of the core substrate 100.

Assume that a thickness T1 of the capacitor 300 is thinner than a thickness T2 of the core substrate 100 including the first wiring layers 200, as illustrated in FIG. 7. In this case, the capacitor 300 is arranged in a position deviated to the upper end side of the cavity C from a thicknesswise center of the cavity C.

The upper faces of the connection terminals 320 of the capacitor 300 are arranged in height positions flush with an upper face of the first wiring layer 200 on the upper face side of the core substrate 100. On the other hand, the lower faces of the connection terminals 320 of the capacitor 300 are arranged in positions sinking inward from a lower face of the first wiring layer 200 on the lower face side of the core substrate 100.

An example in which the first insulating layer 400 is formed flatly without occurrence of any recess at the lower region of the capacitor 300 is illustrated in FIG. 7.

In this case, the thickness of the first insulating layer 400 on the lower region of the capacitor 300 is thicker than a thickness of the insulating layer 420 on an upper region of the capacitor 300 by the amount with which the capacitor 300 is arranged to be deviated to the upper end side inside the cavity C.

Therefore, a depth D1 of a via conductor VC1 in each of the via holes VH connected to the lower faces of the connection terminals 320 of the capacitor 300 is deeper than a depth D2 of a via conductor VC2 in each of the via holes VH connected to the upper faces of the connection terminals 320 of the capacitor 300.

When the structure is formed thus, reliability of electrical connection varies between the via connection in the lower faces of the connection terminals 320 of the capacitor 300 and the via connection in the upper faces of the connection terminals 320 of the capacitor 300.

As illustrated in FIG. 7, the depth D1 of the via conductor VC1 connected to each of the lower faces of the connection terminals 320 of the capacitor 300 is deeper. Accordingly, a connection area between the via conductor VC1 and the connection terminal 320 of the capacitor 300 is smaller for the following reason. Since the via hole VH is formed into a tapered shape by a laser, an area of the bottom of the via hole VH decreases as the depth increases.

Therefore, when thermal stress etc. occurs and stress is hence concentrated on the bottom portion of the via conductor VC1, cracks are apt to occur starting at the bottom portion of the via conductor VC1 to thereby cause lowering of the reliability.

The aforementioned problems can be solved with an electronic component-embedded board according to an embodiment which will be described below.

Embodiment

Figure 18:
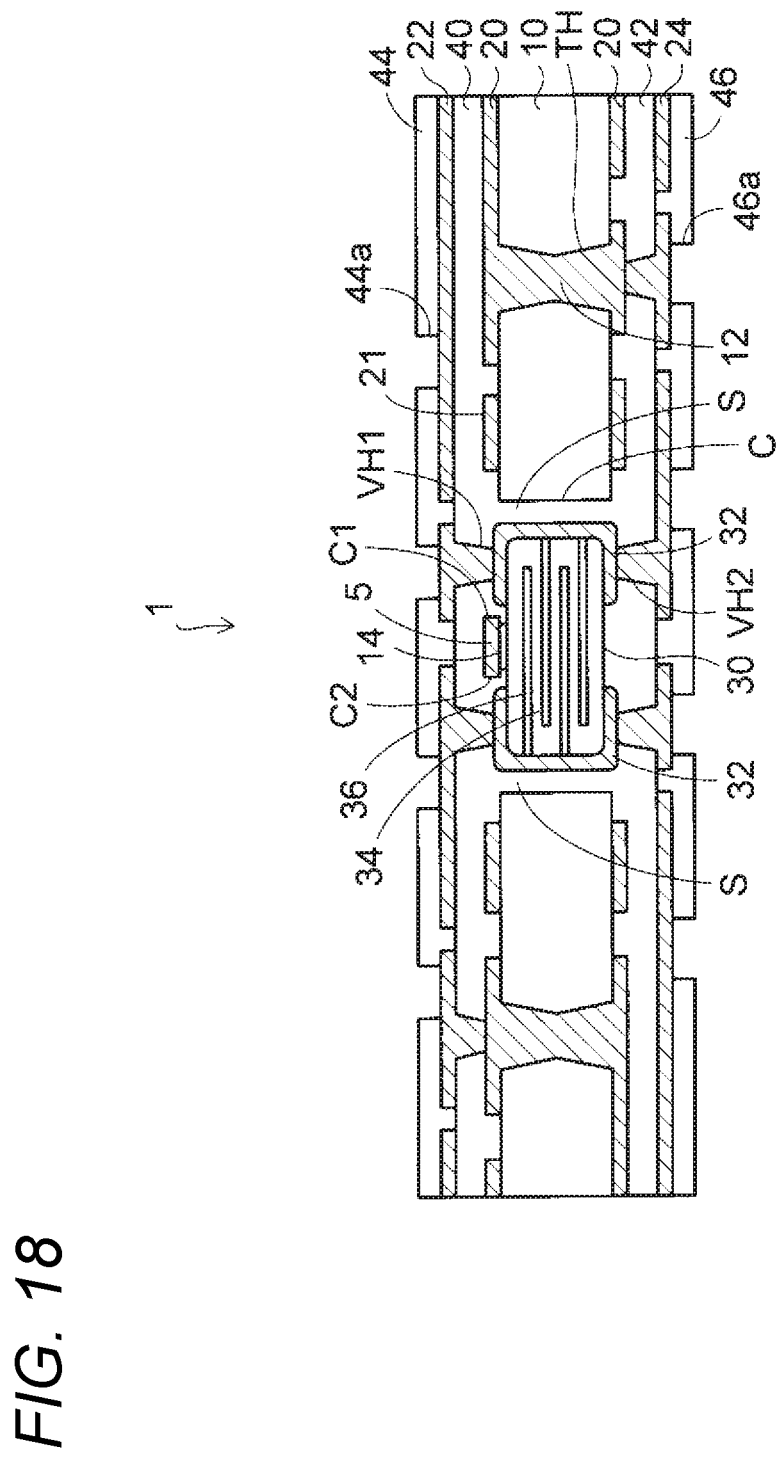
FIG. 18 is a sectional view illustrating the electronic component-embedded board according to the embodiment.
Figure 19:
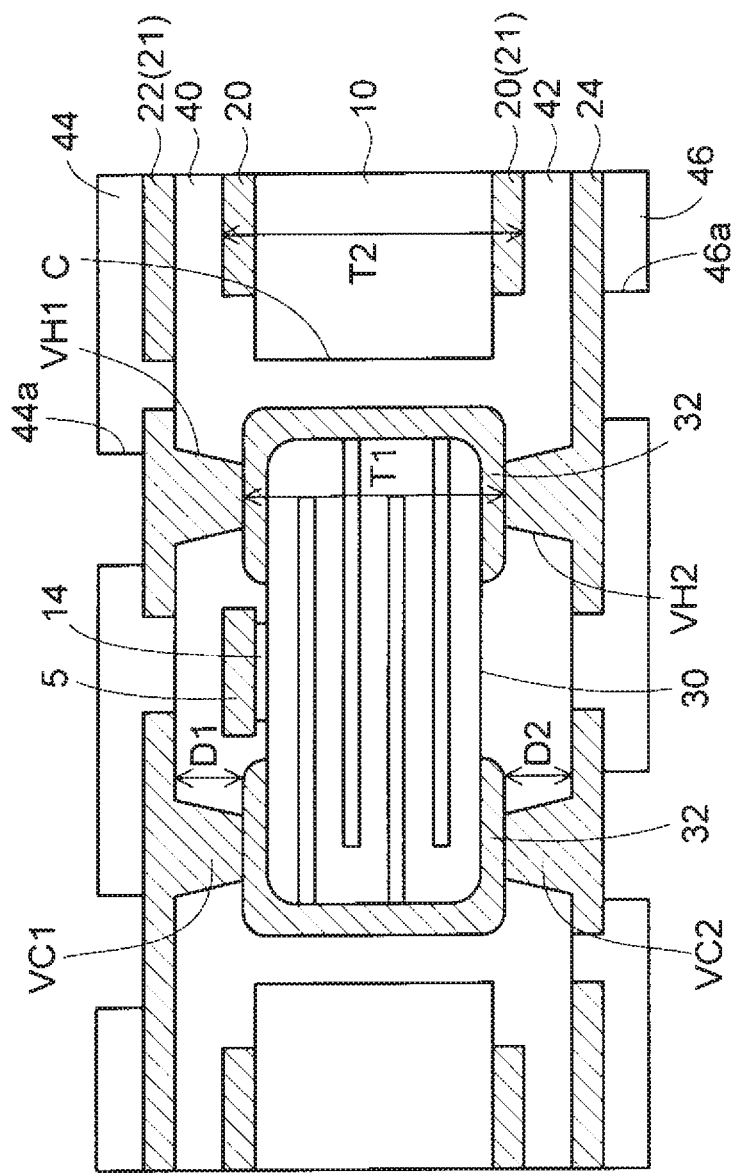
FIG. 19 is a partially enlarged view in which a structure of the electronic component-embedded board around a capacitor in FIG. 18 has been enlarged.

FIGS. 8 to 17 are views for explaining a manufacturing method for the electronic component-embedded board according to the embodiment. FIGS. 18 and 19 are views illustrating the electronic component-embedded board according to the embodiment. The structure of the electronic component-embedded board and the structure of an electronic component device will be described below in parallel with description of the manufacturing method for the electronic component-embedded board.

In the manufacturing method for the electronic component-embedded board according to the embodiment, first, a core substrate 10 having a structure illustrated in FIGS. 8A and 8B is prepared. The core substrate 10 is formed of an insulating material such as glass cloth impregnated with an epoxy resin.

First wiring layers 20 are formed respectively on two face sides of the core substrate 10. Through holes TH are formed to penetrate the core substrate 10 in a thickness direction. The first wiring layers 20 on the two face sides are connected to each other by through conductors 12 formed in the through holes TH. The core substrate 10 is, for example, 60 µm to 500 µm thick.

Alternatively, a through hole plating layer may be formed on an inner wall of each through hole TH of the core substrate 10, and the other part remaining as a hole in the though hole TH may be filled with a resin. In this case, the first wiring layers 20 on the two face sides are connected to each other by the through hole plating layer.

The through holes TH are formed by a drill or a laser. The first wiring layers 20 and the through conductors 12 are made of copper etc. and formed by photolithography, plating technology and wet etching etc.

In the embodiment, description will be made with one face of the core substrate 10 set as an upper face and the other face of the core substrate 10 set as a lower face.

A cavity formation region A where a cavity should be arranged is defined in the core substrate 10.

As illustrated in a partial plan view of FIG. 8B, a belt-like component mounting pattern 5 is arranged on a central portion of the cavity formation region A of the core substrate 10, and two opening portions 20a are arranged side by side on two sides of the component mounting pattern 5. The component mounting pattern 5 is arranged to be laid across the cavity formation region A. Two ends of the component mounting pattern 5 are connected to a ring-like support layer 21 so as to be supported thereby.

A metal layer which is made of copper or aluminum etc. is patterned by photolithography and etching so as to be formed into the first wiring layer 20, the component mounting pattern 5, and the support layer 21 simultaneously. Thus, the component mounting pattern 5 and the support layer 21 are formed from the same layer as the first wiring layer 20. That is, the component mounting pattern 5 and the support layer 21 are formed of the same material as the first wiring layer 20, and the surface of the component mounting pattern 5 and the surface of the support layer 21 are flush with the surface of the first wiring layer 20.

The first wiring layer 20 is an electric wiring for constructing an electric circuit. The component mounting pattern 5 is electrically insulated from the first wiring layer 20 to be formed as a floating conductor. Alternatively, the component mounting pattern 5 may be electrically connected to the first wiring layer 20.

In addition, the first wiring layer 20 is not formed on a lower face of the cavity formation region A of the core substrate 10 so that the cavity formation region A as a whole is formed as an opening portion 20b.

Figure 9A:
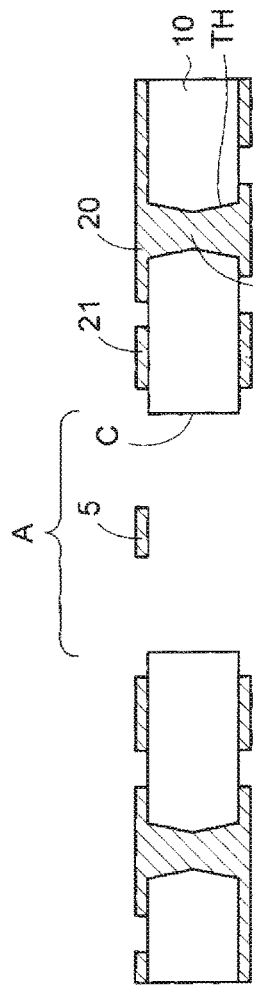
FIGS. 9A to 9C are a sectional view and partial plan views illustrating the manufacturing method for the electronic component-embedded board according to the embodiment (Part 2)
Figure 9B:
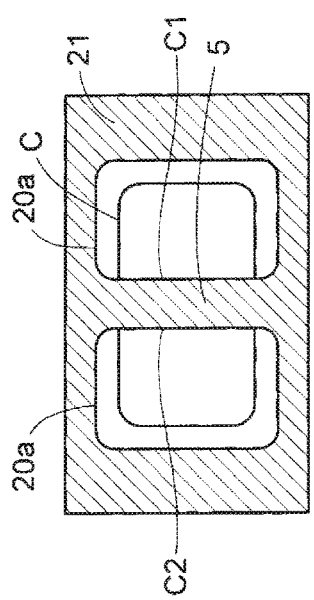
Figure 9C:
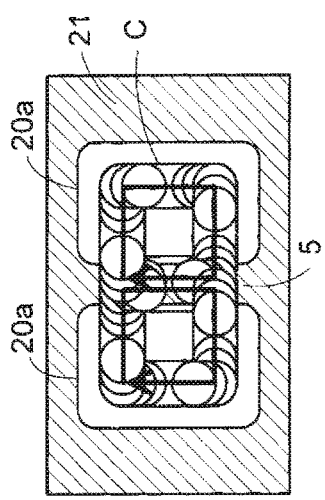

Next, laser machining is applied to the cavity formation region A of the core substrate 10 from below, as illustrated in FIG. 9A, so that a cavity C can be formed to penetrate the core substrate 10, as illustrated in FIGS. 9A to 9C.

On this occasion, laser machining is applied sequentially along portions which will serve as side walls of the cavity C, to thereby hollow unnecessary portions out of the core substrate 10, as illustrated in FIG. 9C. Alternatively, the cavity formation region A of the core substrate 10 may be removed collectively by a laser apparatus which can irradiate a predetermined planar region with laser beams to thereby machine the predetermined planar region collectively.

The component mounting pattern 5 remains undamaged by the laser when laser machining is applied to the core substrate 10 to form a cavity C in the core substrate 10.

As illustrated in a partial plan view of FIG. 9B, the cavity C is formed into a quadrangular shape in plan view, and the belt-like component mounting pattern 5 is arranged on a central portion of the cavity C. The component mounting pattern 5 is arranged to be laid across the cavity C. A width of the component mounting pattern 5 is set to be smaller than a lateral width of the cavity C.

Thus, the component mounting pattern 5 is formed into a belt shape narrower than the width of the opening of the cavity C.

Thus, as illustrated in FIG. 9B, the cavity C is partitioned into two through holes, i.e. a first through hole C1 and a second through hole C2 by the component mounting pattern 5 in plan view.

In the example of FIG. 9B, the cavity C is partitioned into the two, first and second through holes C1 and C2 by the component mounting pattern 5 in order to mount one capacitor.

As will be described later, when a plurality of capacitors are mounted, the component mounting pattern 5 is fundamentally formed into a cross shape so as to define four or more through holes. Thus, the cavity C is partitioned into a plurality of through holes by the component mounting pattern 5 in accordance with the number of capacitors to be mounted.

Figure 10A:
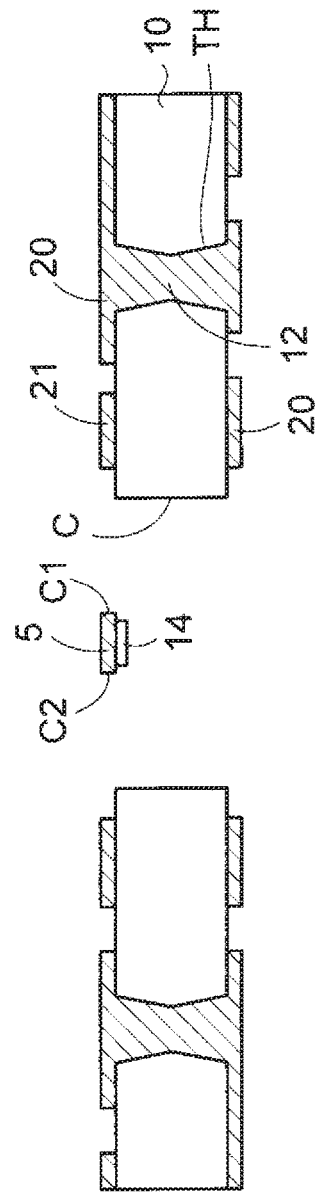
FIGS. 10A and 10B are a sectional view and a partial plan view illustrating the manufacturing method for the electronic component-embedded board according to the embodiment (Part 3)
Figure 10B:
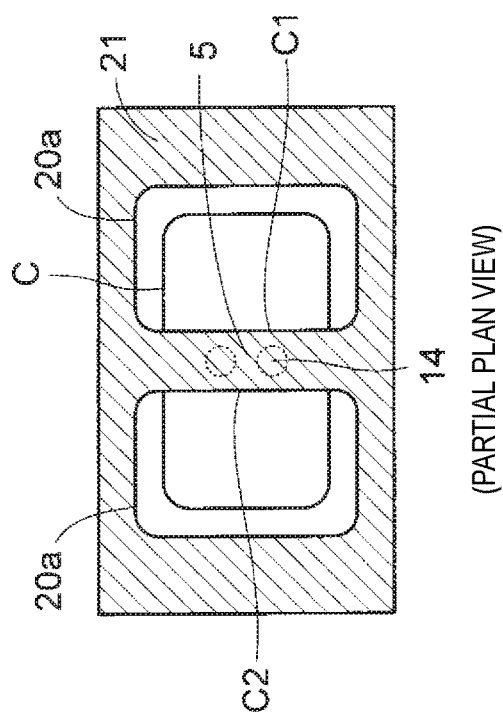

Successively, an adhesive agent 14 is formed on an inner face of the component mounting pattern 5 arranged inside the cavity C, as illustrated in FIG. 10A. The adhesive agent 14 may be formed separately on two places of the component mounting pattern 5, as illustrated in a partial plan view of FIG. 10B.

Figure 11A:
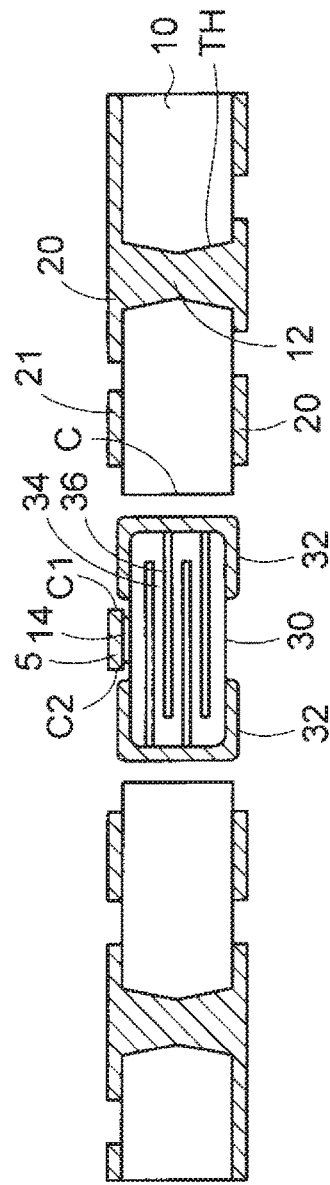
FIGS. 11A and 11B are a sectional view and a partial plan view illustrating the manufacturing method for the electronic component-embedded board according to the embodiment (Part 4)

Further, a capacitor 30 (an example of an electronic component) is prepared, as illustrated in FIG. 11A. The capacitor 30 illustrated in FIG. 11A is a multilayer ceramic chip capacitor having a multilayer structure in which dielectric layers 34 and internal electrodes 36 are disposed on one another alternately.

The capacitor 30 is provided with connection terminals 32 on its two horizontal end sides respectively. One of the connection terminals 32 is connected to one ends of the disposed internal electrodes 36.

The connection terminals 32 on the two end sides of the capacitor 30 are formed to cover a range of from an end portion of an upper face of a capacitor body to an end portion of a lower face of the capacitor body. Wiring layers can be connected to upper faces and lower faces of the connection terminals 32. The capacitor 30 is an example of an electronic component.

By the adhesive agent 14, the upper face of the capacitor 30 is adhesively bonded and fixed to the component mounting pattern 5 which has been arranged inside the cavity C.

A central portion of the capacitor 30 is fixed to the component mounting pattern 5. In addition, a portion of the uppermost dielectric layer 34 of the capacitor 30 is fixed to the component mounting pattern 5.

Figure 11B:
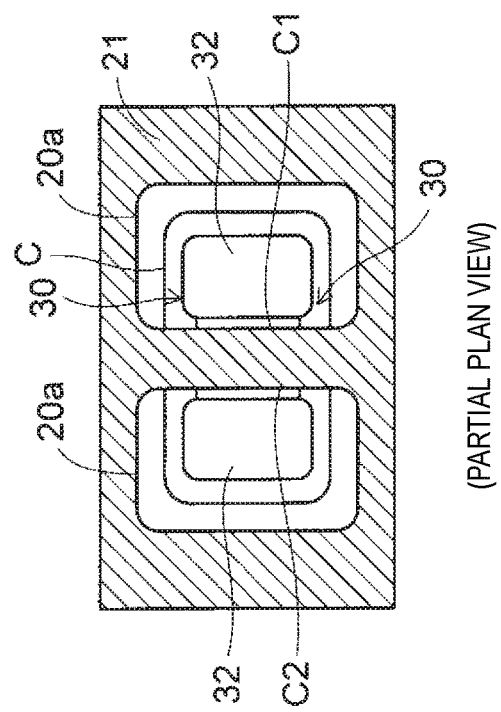

In addition, as illustrated in a partial plan view of FIG. 11B, the connection terminals 32 on the two end sides of the capacitor 30 are arranged to overlap with the first through hole C1 and the second through hole C2 into which the cavity C is partitioned in plan view.

Thus, the capacitor 30 is mounted on the component mounting pattern 5 so that the connection terminals 32 on the two sides of the capacitor 30 cannot touch the component mounting pattern 5 and the first wiring layers 20. The capacitor 30 is mounted in a state in which the capacitor 30 is electrically insulated from the component mounting pattern 5.

In the embodiment, the component mounting pattern 5 formed simultaneously with the first wiring layer 20 is arranged inside the cavity C, and the capacitor 30 is mounted on the component mounting pattern 5. Therefore, it is not necessary to use any temporary fixation tape to mount the capacitor 30 thereon, differently from the manufacturing method according to the preliminary matter. Consequently, the manufacturing process can be simple and the manufacturing cost can be reduced.

Incidentally, in the embodiment, the capacitor 30 is arranged as an example of an electronic component inside the capacity C. However, the electronic component is not limited to the capacitor 30. For example, an inductor, a resistor or a semiconductor element (a transistor, a diode, or the like) may be arranged inside the cavity C in place of the capacitor. In addition, although one component mounting pattern 5 is formed here, two or more component mounting patterns 5 may be formed alternatively. In this case, the capacitor 30 may be mounted on each of the two or more component mounting patterns 5.

Figure 12A:
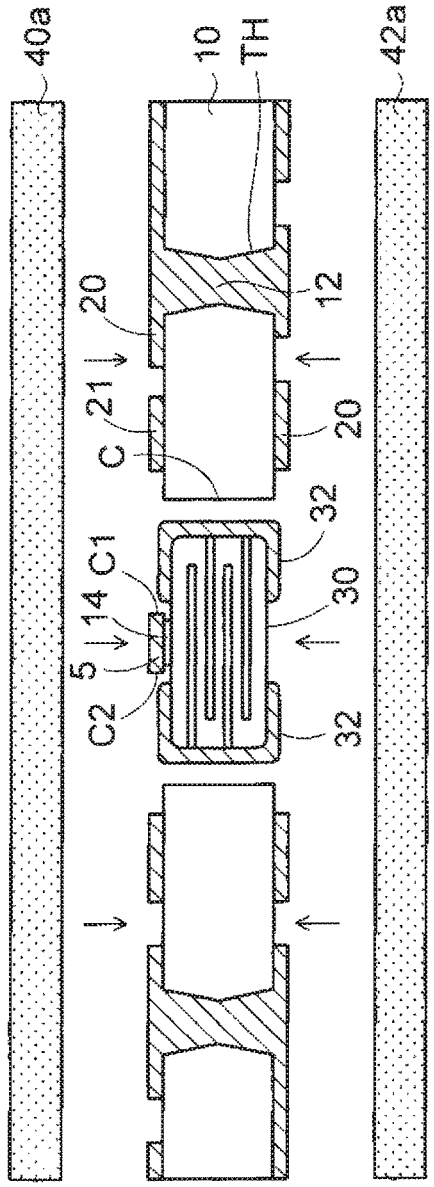
FIGS. 12A and 12B are sectional views illustrating the manufacturing method for the electronic component-embedded board according to the embodiment (Part 5)

Next, as illustrated in FIG. 12A, a first resin film 40a and a second resin film 42a which are uncured are prepared. An insulating resin such as an epoxy resin or a polyimide resin can be used as the material of the first and second resin films 40a and 42a. Each of the first and second resin films 40a and 42a is, for example, 40 μm to 50 μm thick.

The first resin film 40a is disposed on an upper face of a structure body in FIG. 11A by hot press. Simultaneously, the second resin film 42a is disposed on a lower face of the structure body in FIG. 11A by hot press.

Figure 12B:
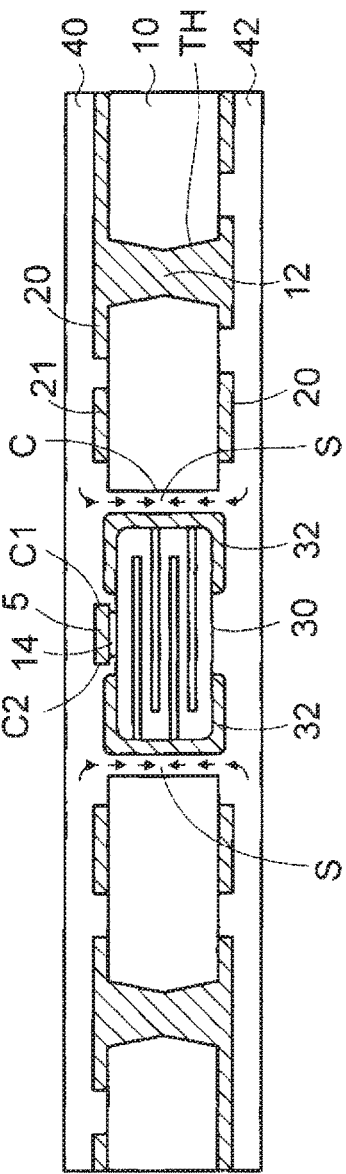

Further, as illustrated in FIG. 12B, the first insulating resin film 40a on the upper face side of the core substrate 10 is cured by heating treatment to thereby obtain a first insulating layer 40. Simultaneously, the second resin film 42a on the lower face side of the core substrate 10 is cured by heating treatment to thereby obtain a second insulating layer 42.

Thus, the first insulating layer 40 is formed on the upper face of the core substrate 10 so that the first and second through holes C1 and C2 can be filled with the first insulating layer 40 and the upper face of the capacitor 30 can be covered with the first insulating layer 40. In addition, the second insulating layer 42 is formed on the lower face of the core substrate 10 so that the lower face of the capacitor 30 can be covered with the second insulating layer 42.

Thus, the capacitor 30 is mounted on the component mounting pattern 5 arranged inside the cavity C without using any temporary fixation tape in the embodiment. Therefore, the first resin film 40a and the second resin film 42a can be disposed simultaneously on the two face sides of the capacitor 30.

Accordingly, a space S between an inner wall of the cavity C of the core substrate 10 and side faces of the capacitor 30 is filled with the resin which flows from the first insulating resin film 40a on the upper side and the second insulating resin film 42a on the lower side.

Accordingly, the resin with an enough volume is left on an upper region and a lower region of the capacitor 30. Thus, the first insulating layer 40 and the second insulating layer 42 can be prevented from being formed into recesses at the upper region and the lower region of the capacitor 30. Thus, each of outer faces of the first insulating layer 40 and the second insulating layer 42 is formed flatly as a whole.

As a result, the first insulating layer 40 and the second insulating layer 42 are formed stably with desired thicknesses on the two face sides of the connection terminals 32 of the capacitor 30. Therefore, when via holes are formed on the two face sides of the capacitor 30 as will be described later, a variation in depth among the via holes can be reduced and reliability of via connection can be improved.

In FIGS. 12A and 12B, a thickness of the capacitor 30 substantially corresponds to a thickness of the core substrate 10 including the first wiring layers 20. Therefore, the first insulating layer 40 and the second insulating layer 42 which are formed on the two face sides of the core substrate 10 are formed with substantially the same thickness.

Figure 13:
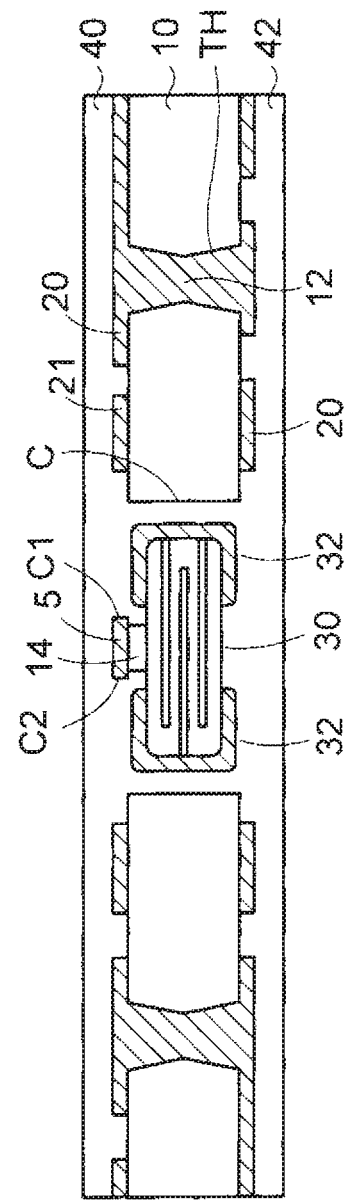
FIG. 13 is a sectional view illustrating the manufacturing method for the electronic component-embedded board according to the embodiment (Part 6)

The thickness of the capacitor 30 is set to be thinner than the thickness of the core substrate 10 including the first wiring layers 20 as illustrated in FIG. 13. In this case, an adhesive agent 14 with high viscosity is used. The adhesive agent 14 is adjusted to be so thick in thickness that the capacitor 30 can be arranged at a heightwise center of the cavity C of the core substrate 10.

In this manner, the first insulating layer 40 and the second insulating layer 42 which are formed on the two face sides of the capacitor 30 can be formed with the same thickness even when the thickness of the capacitor 30 is thinner than the thickness of the core substrate 10.

Accordingly, the via holes to be arranged on the two face sides of the capacitor 30 can be set to have the same depth, as will be described later. Consequently, reliability of via connection can be made equal between the two face sides of the capacitor 30.

Thus, when the capacitor 30 is mounted on the component mounting pattern 5, the thickness of the adhesive agent 14 can be adjusted to thereby adjust the height position of the capacitor 30.

Thus, a height (step) between one face of the core substrate 10 and one face of the capacitor 30 and a height (step) between the other face of the core substrate 10 and the other face of the capacitor 30 can be equal to each other.

Figure 14:
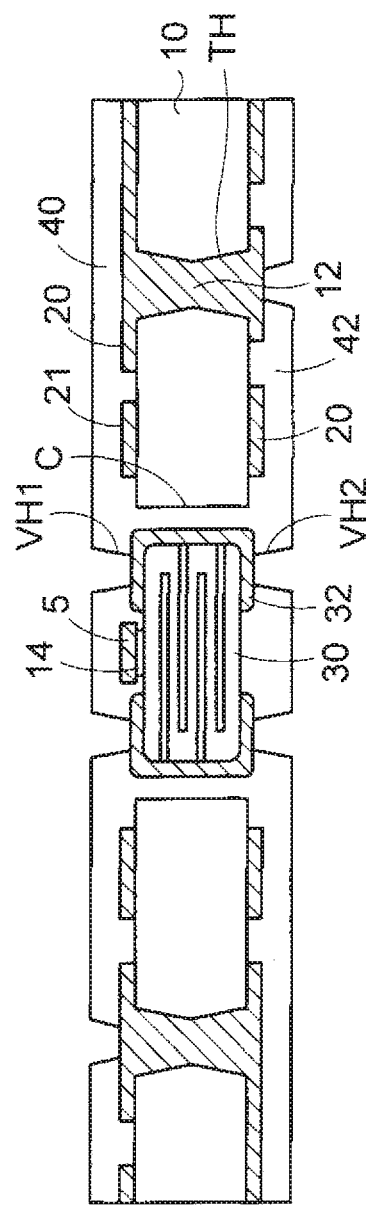
FIG. 14 is a sectional view illustrating the manufacturing method for the electronic component-embedded board according to the embodiment (Part 7)

Next, as illustrated in FIG. 14, laser machining is applied to the first insulating layer 40 on the upper face side of the core substrate 10 to thereby form first via holes VH1 reaching the upper faces of the connection terminals 32 of the capacitor 30 and the first wiring layer 20. Simultaneously, laser machining is applied to the second insulating layer 42 on the lower face side of the core substrate 10 to thereby form second via holes VH2 reaching the lower faces of the connection terminals 32 of the capacitor 30 and the first wiring layer 20.

Figure 15:
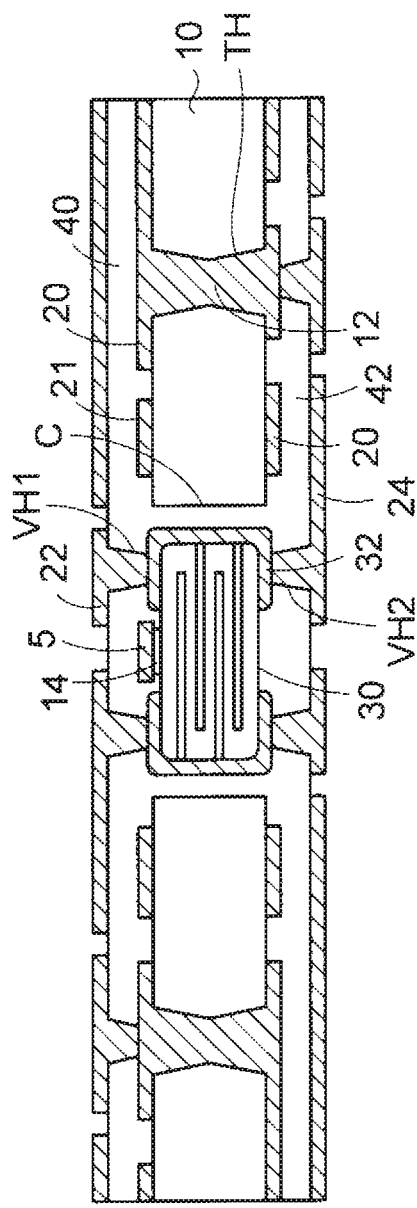
FIG. 15 is a sectional view illustrating the manufacturing method for the electronic component-embedded board according to the embodiment (Part 8)

Successively, as illustrated in FIG. 15, a second wiring layer 22 is formed on the first insulating layer 40. The second wiring layer 22 is connected to the upper faces of the connection terminals 32 of the capacitor 30 and the first wiring layer 20 through the first via holes VH1.

Similarly, a third wiring layer 24 is formed on the second insulating layer 42. The third wiring layer 24 is connected to the lower faces of the connection terminals 32 of the capacitor 30 and the first wiring layer 20 through the second via holes VH2.

Figure 16A:
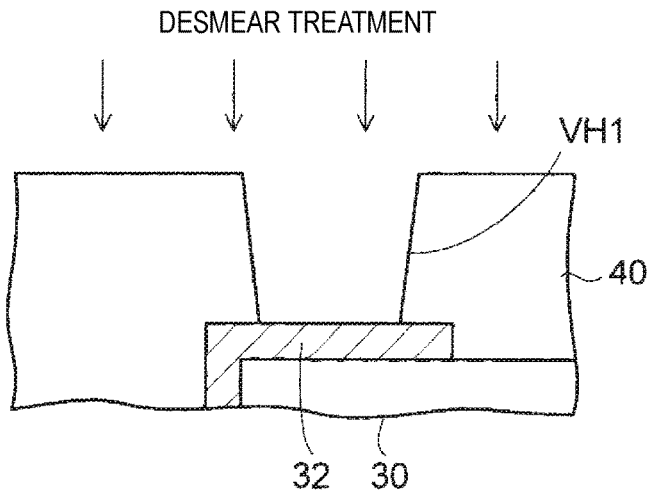
FIG. 16A to 16C are sectional views illustrating a forming method for a second wiring layer in FIG. 15 (Part 1)

The second wiring layer 22 and the third wiring layer 24 are formed by a semi-additive method. FIG. 16A is a partially enlarged view in which the vicinity of the aforementioned first via hole VH1 on the left connection terminal 32 of the capacitor 30 in FIG. 14 is enlarged.

To give detailed description, first, as illustrated in FIG. 16A, the inside of the first via hole VH1 is desmeared by a permanganate method etc. to thereby remove and clean resin smears inside the first via hole VH1.

Figure 16B:
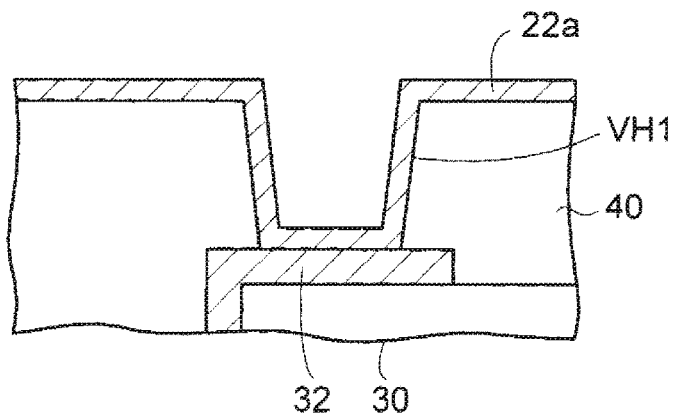

Next, as illustrated in FIG. 16B, a seed layer is formed on an inner wall of the first via hole VH1 and the first insulating layer 40 by electroless plating or a sputtering method.

Figure 16C:
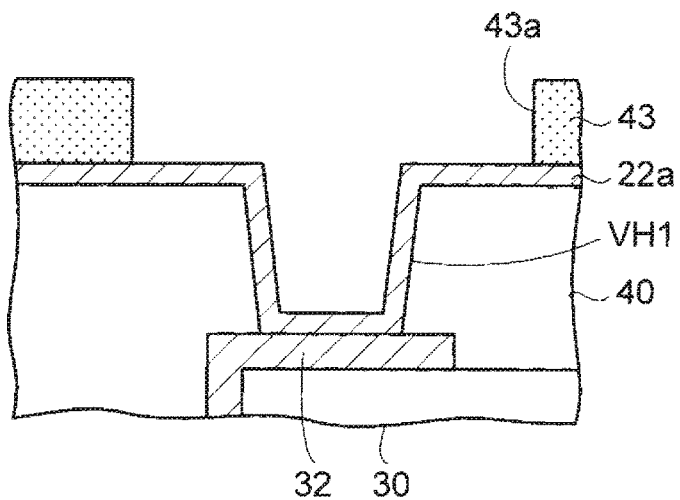

Further, as illustrated in FIG. 16C, a plating resist layer 43 is formed. The plating resist layer 43 is provided with an opening portion 43a at a region where the second wiring layer 22 should be arranged.

Figure 17A:
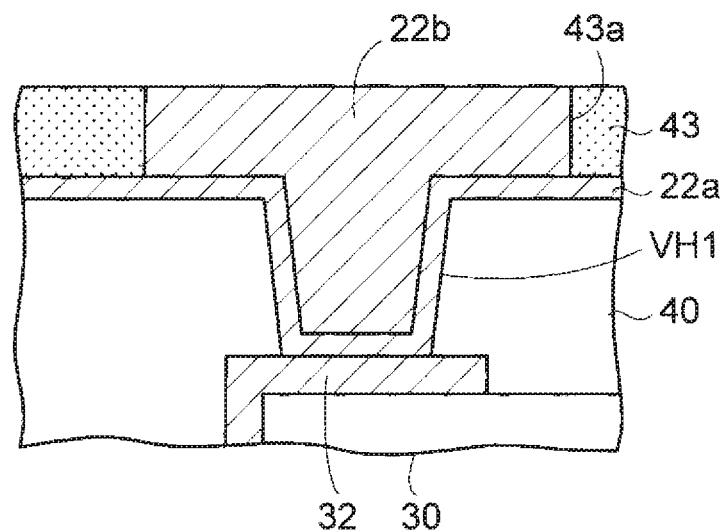
FIGS. 17A and 17B are sectional views illustrating the forming method for the second wiring layer in FIG. 15 (Part 2)

Next, as illustrated in FIG. 17A, by electrolytic plating using the seed layer 22a as a plating power feeding path, a metal plating layer 22b is formed so that the first via hole VH1 and the opening portion 43a of the plating resist layer 43 can be filled with the metal plating layer 22b. The seed layer 22a and the metal plating layer 22b are formed of copper etc.

Figure 17B:
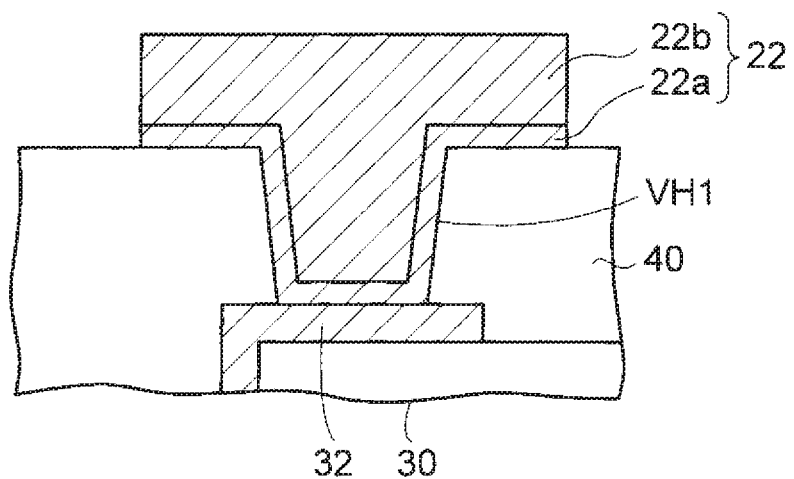

Further, after the plating resist layer 43 is removed as illustrated in FIG. 17B, the seed layer 22a is etched with the metal plating layer 22b as a mask.

In the aforementioned manner, the second wiring layer 22 is formed from the seed layer 22a and the metal plating layer 22b.

Alternatively, the second wiring layer 22 and the third wiring layer 24 may be formed by an MSAP (Modified Semi Additive Process) method or a subtractive method.

Then, as illustrated in FIG. 18, a solder resist layer 44 which is provided with opening portions 44a on connection portions of the second wiring layer 22 is formed on the first insulating layer 40 in FIG. 15. Similarly, a solder resist layer 46 which is provided with opening portions 46a on connection portions of the third wiring layer 24 is formed on the second insulating layer 42 in 15.

As illustrated in FIG. 18, an electronic component-embedded board 1 according to the embodiment is manufactured in the aforementioned manner.

FIG. 19 is a partially enlarged view in which the structure of the electronic component-embedded board 1 around the capacitor 30 in FIG. 18 is enlarged.

As illustrated in FIG. 18, the electronic component-embedded board 1 according to the embodiment is provided with the core substrate 10 at its thicknesswise center. The core substrate 10 has the aforementioned structure described in FIGS. 8A and 8B. The first wiring layers 20 are formed on the two faces of the core substrate 10 respectively. The first wiring layers 20 on the two face sides are connected to each other by the through conductors 12 formed in the through holes TH of the core substrate 10.

The cavity C is formed to penetrate the core substrate 10 in the thickness direction. With additional reference to the aforementioned partial plan view of FIG. 11B, the component mounting pattern 5 is arranged on the upper face of the core substrate 10 so as to be laid across the cavity C.

The component mounting pattern 5 is connected to the ring-like support layer 21 to be supported thereby. The component mounting pattern 5 and the support layer 21 are formed from the same layer as the first wiring layer 20. That is, the component mounting pattern 5 and the support layer 21 are formed of the same material as the first wiring layer 20, and the surfaces of the component mounting pattern 5 and the support layer 21 are flush with the surface of the first wiring layer 20. In the example of FIGS. 11A and 11B, the component mounting pattern 5 and the support layer 21 are insulated from the first wiring layer 20. However, they may be connected to the first wiring layer 20 alternatively.

When the aforementioned cavity C in FIG. 11B is viewed planarly, the cavity C is formed into a quadrangular shape, and the component mounting pattern 5 is arranged like a belt on the central portion of the cavity C.

In addition, when the cavity C is viewed planarly, the cavity C is partitioned into the two through holes, i.e. the first through hole C1 and the second through hole C2, by the component mounting pattern 5. The component mounting pattern 5 is arranged like a belt to separate the cavity C into the first through hole C1 and the second through hole C2.

By the adhesive agent 14, the aforementioned capacitor 30 described in FIG. 11A is fixed to the inner face of the component mounting pattern 5 arranged inside the cavity C. The capacitor 30 is provided with the connection terminals 32 on its two end sides.

The portion of the dielectric layer 34 on the upper face side of the capacitor 30 is fixed to the component mounting pattern 5 by the adhesive agent 14. The connection terminals 32 on the two end sides of the capacitor 30 are arranged to overlap with the first through hole C1 and the second through hole C2 into which the cavity C is partitioned in plan view. The connection terminals 32 of the capacitor 30 are arranged separately from the component mounting pattern 5 so as to be electrically insulated therefrom.

In addition, the first insulating layer 40 is formed on the upper face side of the core substrate 10. The first through hole C1 and the second through hole C2 are filled with the first insulating layer 40. The upper face of the capacitor 30 and the first wiring layer 20 are covered with the first insulating layer 40.

In addition, the second insulating layer 42 is formed on the lower face side of the core substrate 10 so that the lower face of the capacitor 30 and the first wiring layer 20 can be covered with the second insulating layer 42.

The space S between the inner wall of the capacity C of the core substrate 10 and the side faces of the capacitor 30 is filled with the first insulating layer 40 and the second insulating layer 42. In this manner, the cavity C is filled with the first insulating layer 40 and the second insulating layer 42.

As described in the aforementioned step of FIGS. 12A and 12B, an upper portion of the space S is filled with the first insulating layer 40, and a lower portion of the space S is filled with the second insulating layer 42, so that the first and second insulating layers 41 and 42 can be integrated with each other inside the space S.

In addition, the first via holes VH1 reaching the upper faces of the connection terminals 32 of the capacitor 30 and the first wiring layer 20 on the upper side of the core substrate 10 are formed in the first insulating layer 40. The second wiring layer 22 is formed on the first insulating layer 40. The second wiring layer 22 is connected to the upper faces of the connection terminals 32 of the capacitor 30 and the first wiring layer 20 through via conductors in the first via holes VH1.

In addition, the second via holes VH2 reaching the lower faces of the connection terminals 32 of the capacitor 30 and the first wiring layer 20 on the lower side of the core substrate 10 are formed in the second insulating layer 42. The third wiring layer 24 is formed on the second insulating layer 42. The third wiring layer 24 is connected to the lower faces of the connection terminals 32 of the capacitor 30 and the first wiring layer 20 through via conductors in the second via holes VH2.

Further, the solder resist layer 44 which is provided with the opening portions 44a on the connection portions of the second wiring layer 22 is formed on the first insulating layer 40. Similarly, the solder resist layer 46 which is provided with the opening portions 46a on the connection portions of the third wiring layer 24 is formed on the second insulating layer 42.

In the example of FIG. 18, two wiring layers are disposed on each of the two face sides of the core substrate 10. However, the number of wiring layers to be formed and disposed on each of the two face sides of the core substrate 10 can be set desirably.

As described in the aforementioned manufacturing method, in the electronic component-embedded board 1 according to the embodiment, the capacitor 30 is mounted on the component mounting pattern 5 arranged inside the cavity C of the core substrate 10.

Therefore, it is not necessary to use any temporary fixation tape when the capacitor 30 is mounted. In addition, the first insulating layer 40 and the second insulating layer 42 can be formed simultaneously on the upper and lower face sides of the capacitor 30. Consequently, the manufacturing process can be simple, and the manufacturing cost can be reduced.

Further, as described in the aforementioned step of FIGS. 12A and 12B, the resin is made to flow simultaneously from the upper and lower face sides of the capacitor 30 to thereby form the first insulating layer 40 and the second insulating layer 42.

Thus, even when the resin flows into the space S between the inner wall of the cavity C of the core substrate 10 and the side faces of the capacitor 30, the resin with an enough volume can be left on the upper region and the lower region of the capacitor 30. Therefore, the first insulating layer 40 and the second insulating layer 42 can be prevented from being formed into recesses at the regions covering the capacitor 30.

As a result, a variation in depth between each first via hole VH1 and each second via hole VH2 in the core substrate 10 or among a plurality of core substrates 10 can be reduced so that the manufacturing yield can be improved.

In addition, the capacitor 30 is arranged inside the cavity C of the core substrate 10 and mounted on the component mounting pattern 5 through the adhesive agent 14, as illustrated in the partially enlarged sectional view of FIG. 19.

Therefore, the adhesive agent 14 is used as a stand whose thickness can be adjusted. With the configuration, the thickness of the first insulating layer 40 on the upper side of the capacitor 30 and the thickness of the second insulating layer 42 on the lower side of the capacitor 30 can be adjusted to be equal to each other.

Assume that the thickness T1 of the capacitor 30 in FIG. 19 is thinner than the thickness T2 of the core substrate 10 including the first wiring layers 20. In this case, the thickness of the adhesive agent 14 can be increased so that the capacitor 30 can be arranged at the heightwise center of the cavity C, as described above in FIG. 13.

In this manner, the thickness of the first insulating layer 40 on the upper side of the capacitor 30 and the thickness of the second insulating layer 42 on the lower side of the capacitor 30 can be set to be equal to each other even in the case where an electronic component thinner than the entire thickness of the core substrate 10 is mounted.

Accordingly, a depth D1 of the via conductor VC1 in each first via hole VH on the upper side of the capacitor 30 and a depth D2 of the via conductor VC2 in each second via hole VH2 on the lower side of the capacitor 30 can be set to be equal to each other, as illustrated in FIG. 19.

Thus, cracks can be prevented from occurring at any via conductor due to an increase in the depth of the corresponding via hole on one face side of the capacitor 30 so that reliability of via connection can be improved. Thus, high reliability of via connection can be obtained equally between the upper faces and the lower faces of the connection terminals 32 of the capacitor 30.

In the embodiment, the capacitor 30 is illustrated as the electronic component. However, various electronic components such as a semiconductor chip and an inductor can be mounted alternatively.

When a semiconductor chip is used, a back face of the semiconductor chip provided with an element formation region on its front face side is mounted on the component mounting pattern 5 inside the cavity C of the core substrate 10 by the adhesive agent 14. Via holes are arranged on connection pads arranged at the element formation region on the front face side of the semiconductor chip, and a wiring layer is connected to the connection pads through the via holes.

Alternatively, a semiconductor device in which the semiconductor chips are disposed on one another by TSV (Through Silicon Via) technology may be used. In this case, connection pads are arranged on two face sides of the semiconductor device, and wiring layers can be connected to the connection pads on the two face sides respectively.

Figure 20:
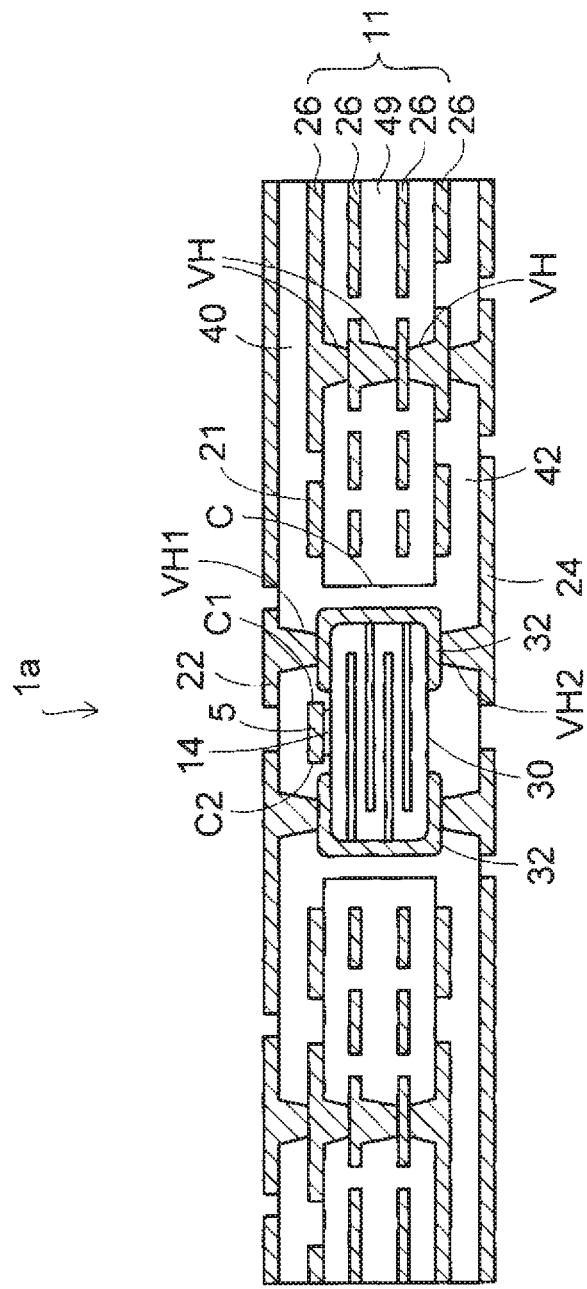
FIG. 20 is a sectional view illustrating an electronic component-embedded board according to a modification of the embodiment.

An electronic component-embedded board 1a according to a modification of the embodiment is illustrated in FIG. 20. As in the electronic component-embedded board 1a according to the modification in FIG. 20, a core substrate 11 in which a multilayer wiring has been built may be used in place of the core substrate 10 of the electronic component-embedded board 1 in FIG. 18.

In the example of FIG. 20, four wiring layers 26 are disposed on one another through insulating layers 49 in the core substrate 11. The four wiring layers 26 are connected to one another through via conductors in via holes VH formed in the insulating layers 49. A component mounting pattern 5 may be formed simultaneously when the uppermost wiring layer 26 of the core substrate 11 is formed.

No multilayer wiring is formed inside a cavity formation region of the core substrate 11. Therefore, a similar cavity C can be formed by laser machining which is applied to the cavity formation region of the core substrate 11. Similarly, a capacitor 30 can be mounted on the component mounting pattern 5 inside the cavity C.

Thus, a similar structure can be constructed easily even in the core substrate 11 in which the multilayer wiring has been built.

In FIG. 20, elements other than the structure of the core substrate 11 are the same as those described above in FIG. 18. Accordingly, the elements will be referred to by the same signs correspondingly and respectively, and description thereof will be omitted.

Next, embodiments which capacitors 30 are mounted on a component mounting pattern 5 inside the cavity C of the core substrate 10 will be described.

Initially, an embodiment which two capacitors 30 are mounted will be described. FIGS. 21A to 21C and FIGS. 22 and 23 are partial plan views illustrating states in each of which two capacitors are mounted on the component mounting pattern.

Figure 21A:
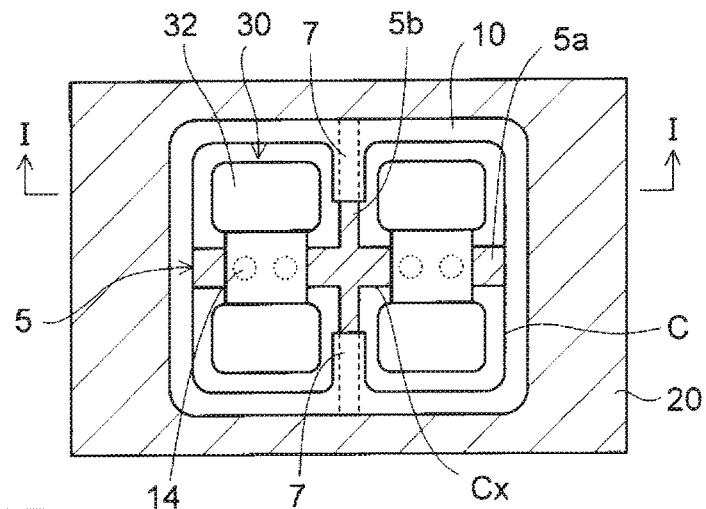
FIGS. 21A to 21C are partial plan views and a sectional view illustrating a first example of a case where two capacitors are mounted.
Figure 21B:
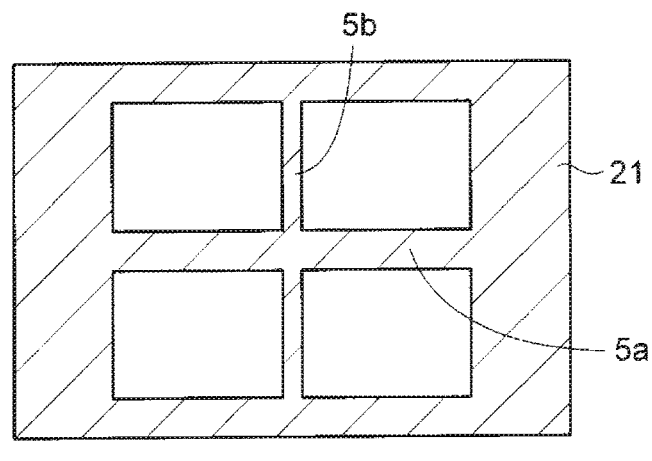
Figure 21C:
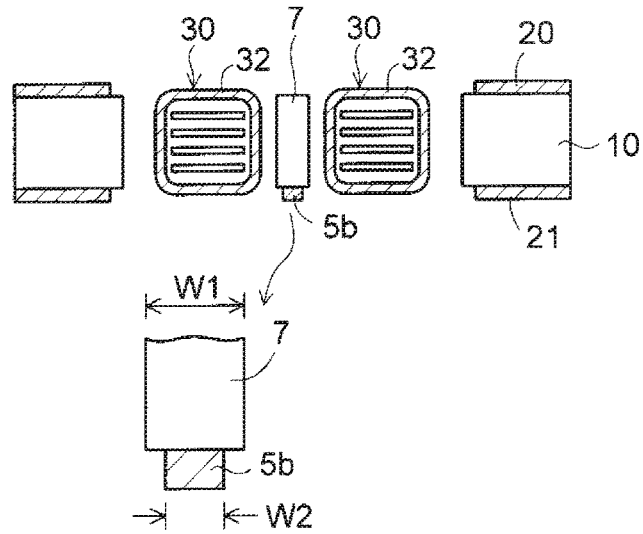

FIGS. 21A to 21C are views illustrating a first example of the case where two capacitors are mounted. FIG. 21B is a plan view in which only the component mounting pattern 5 in FIG. 21A is seen from a back side. FIG. 21C is a sectional view taken along a line I-I of FIG. 21A.

As illustrated in FIGS. 21A and 21B, the component mounting pattern 5 is arranged like a cross inside the cavity C of the core substrate 10 in plan view in the first example of the case where two capacitors are mounted.

As illustrated in FIG. 21B, the cross-shaped component mounting pattern 5 has a horizontal pattern 5a and a vertical pattern 5b perpendicular to the horizontal pattern 5a. Two ends of the horizontal pattern 5a and two ends of the vertical pattern 5b are connected to a support layer 21 so as to be supported thereby.

As illustrated in FIG. 21A, the horizontal pattern 5a and the vertical pattern 5b are arranged to be laid across the cavity C respectively. The cavity C is partitioned into four through holes Cx by the cross-shaped component mounting pattern 5 in plan view.

Two capacitors 30 are arranged side by side to be mounted on the horizontal pattern 5a on two sides of the vertical pattern 5b. Connection terminals 32 on two sides of each of the capacitors 30 are mounted to face each other in the vertical direction. The connection terminals 32 are arranged to overlap with the corresponding through holes Cx arranged in the vertical direction respectively.

With the provision of the vertical pattern 5*b*, the horizontal pattern 5*a* can be prevented from being deformed by weights of the capacitors 30 even when the capacitors 30 are mounted on the horizontal pattern 5*a*.

In addition, with additional reference to the sectional view of FIG. 21C, insulating wall portions 7 formed of the same material as the core substrate 10 are arranged on two end portions of the vertical pattern 5*b* of the cross-shaped component mounting pattern 5. In FIG. 21A, the insulating wall portions 7 are connected to a body of the core substrate 10 so as to be formed integrally therewith.

Thus, each of the insulating wall portions 7 is arranged between horizontally adjacent ones of the connection terminals 32 of the two capacitors 30 in the embodiment. Thus, when the capacitors 30 are mounted on the component mounting pattern 5, the connection terminals 32 of the two capacitors 30 can be prevented from touching each other respectively by the insulating wall portions 7 even if the capacitors 30 are rotated to be mounted on the component mounting pattern 5 obliquely.

As illustrated in the sectional view of FIG. 21C, a width W1 of each insulating wall portion 7 is set to be wider than a width W2 of the vertical pattern 5*b* of the component mounting pattern 5. Therefore, when the two capacitors 30 are mounted on the component mounting pattern 5, the connection terminals 32 of the capacitors 30 can be prevented from touching the vertical pattern 5*b* to cause electrical short-circuiting between the two capacitors 30.

In FIG. 21C, a height of the wall insulating portion 7 is set to be equal to the thickness of the core substrate 10. However, the height of the wall insulating portion 7 may be set to be lower than the thickness of the core substrate 10 alternatively.

The insulating wall portions 7 are arranged as portions of the core substrate 10 which are left on the two end portions of the vertical pattern 5*b* of the component mounting pattern 5 when laser machining is applied to the core substrate 10 to form the cavity C in the core substrate 10.

Figure 22:
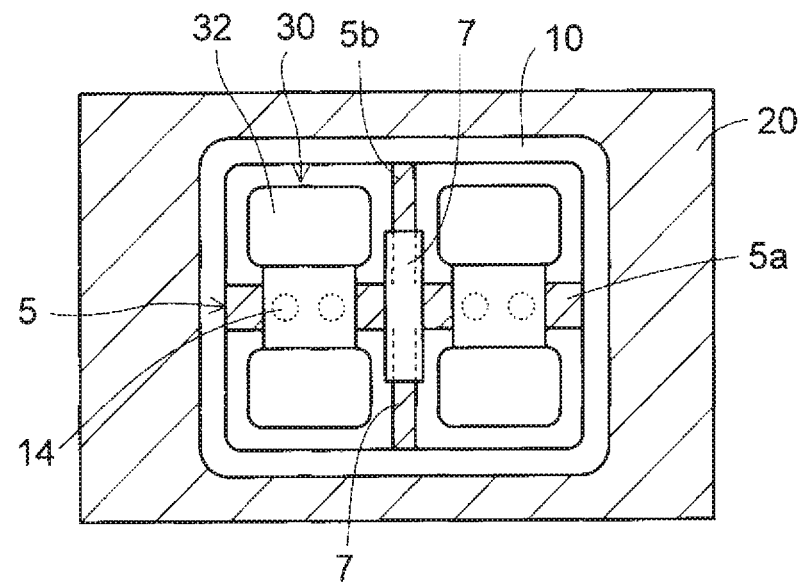
FIG. 22 is a partial plan view illustrating a second example of the case where two capacitors are mounted.

A second example of the case where two capacitors are mounted is illustrated in FIG. 22. As illustrated in FIG. 22, an insulating wall portion 7 may be formed separately from the core substrate 10 and arranged on a central portion of a vertical pattern 5*b* of a cross-shaped component mounting pattern 5.

Also in the second example of FIG. 22, the insulating wall portion 7 is present between horizontally adjacent ones of the connection terminals 32 of the capacitors 30. Accordingly, the connection terminals 32 of the capacitors 30 can be prevented from touching each other respectively.

When the two capacitors 30 are mounted to be horizontally adjacent to each other as in FIG. 22, it will be difficult to fill a region between the two capacitors 30 with a resin if the insulating wall portion 7 is absent. Therefore, there is a fear that the region between the two capacitors 30 may be formed into a recess.

In FIG. 22, the insulating wall portion 7 is arranged in advance on the central portion of the vertical pattern 5*b* between the two capacitors 30. Therefore, it is not necessary to fill the region with the resin. Consequently, the resin can be filled reliably when the two capacitors 30 are sealed with the resin.

Figure 23:
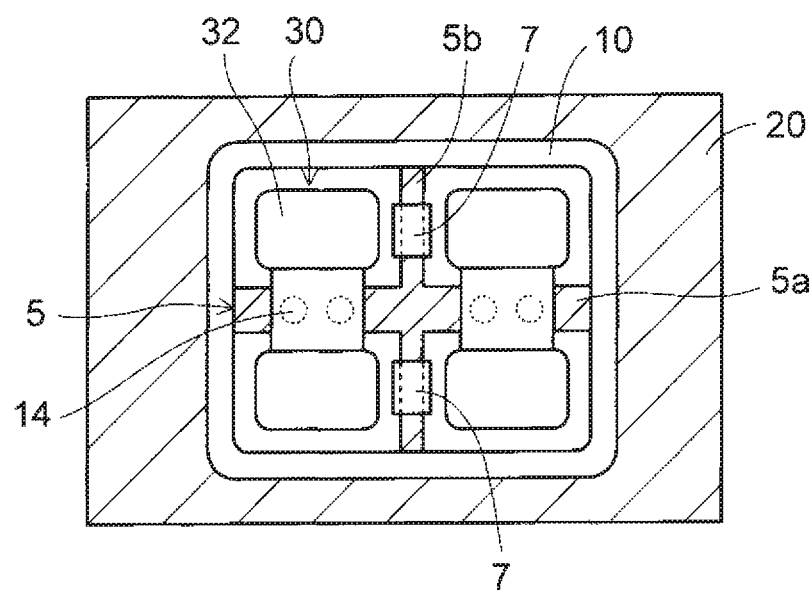
FIG. 23 is a partial plan view illustrating a third example of the case where two capacitors are mounted.

In addition, a third example of the case where two capacitors are mounted is illustrated in FIG. 23. As illustrated in FIG. 23, insulating wall portions 7 may be formed separately from the core substrate 10 and arranged separately from each other on a vertical pattern 5*b* of a cross-shaped component mounting pattern 5. Also in the third example, each of the insulating wall portions 7 is arranged between horizontally adjacent ones of the connection terminals 32 of the two capacitors 30 in a similar manner. Accordingly, the connection terminals 32 of the capacitors 30 can be prevented from touching each other respectively.

Thus, the insulating wall portions 7 are formed on the component mounting pattern 5 serving as a support plate in this example. Accordingly, the insulating wall portions 7 can be arranged in any positions on the component mounting pattern 5 in a state in which the insulating wall portions 7 are separated from the core substrate 10.

Thus, the insulating wall portions 7 can be arranged in most suitable positions in which electrical short-circuiting can be prevented from occurring between the two capacitors 30 and the resin can be filled excellently.

In addition, a width W1 of each insulating wall portion 7 is set to be wider than a width W2 of the vertical pattern 5*b* of the component mounting pattern 5. Thus, electrical short-circuiting can be prevented from occurring between the two capacitors 30. Accordingly, a pitch for arrangement of capacitors 30 can be also narrowed so that mounting density of the capacitors 30 can be improved.

Incidentally, one horizontal pattern 5*a* is formed in the embodiment. However, two or more horizontal patterns 5*a* may be formed alternatively. In this case, two capacitors 30 may be mounted on each of the two or more horizontal patterns 5*a*.

Next, an embodiment which four capacitors 30 are mounted will be described. FIGS. 24 to 27 are partial plan views illustrating states in each of which four capacitors are mounted on component mounting patterns.

Figure 24:
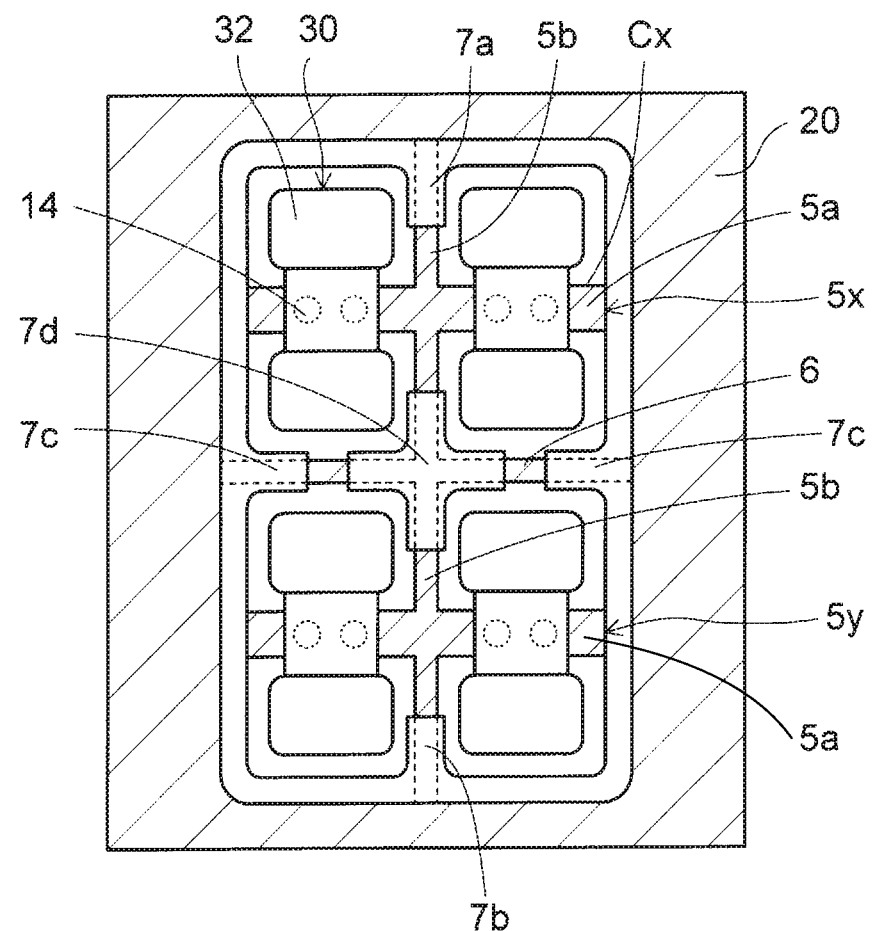
FIG. 24 is a partial plan view illustrating a first example of a case where four capacitors are mounted.

FIG. 24 is a view illustrating a first example of the case where four capacitors are mounted. In the first example of the case where four capacitors are mounted, as illustrated in FIG. 24, two cross-shaped component mounting patterns 5 each of which is the same as that arranged inside the aforementioned cavity C in FIG. 21A are arranged side by side in a vertical direction.

A coupling bar 6 which extends in a horizontal direction is arranged between the upper cross-shaped component mounting pattern 5*x* and the lower cross-shaped component mounting pattern 5*y*. The coupling bar 6 is connected to a support layer 21 (see FIG. 21B) to be supported thereby. The support layer 21 supports the cross-shaped component mounting patterns 5*x* and 5*y*.

A lower end of a vertical pattern 5*b* of the upper cross-shaped component mounting pattern 5*x* is connected to the coupling bar 6 so as to be supported thereby. In addition, an upper end of a vertical pattern 5*b* of the lower cross-shaped component mounting pattern 5*y* is connected to the coupling bar 6 so as to be supported thereby.

An insulating wall portion 7*a* connected to the core substrate 10 is formed on an upper portion of the vertical pattern 5*b* of the upper cross-shaped component mounting pattern 5*x*. In addition, an insulating wall portion 7*b* connected to the core substrate 10 is formed on a lower portion of the vertical pattern 5*b* of the lower cross-shaped component mounting pattern 5*y*.

Further, insulating wall portions 7*c* connected to the core substrate 10 are formed on two end portions of the coupling bar 6. In addition, a cross-shaped insulating wall portion 7*d* is formed at an intersection portion between the coupling bar 6 and the vertical patterns 5*b* and separately from the core substrate 10.

Two capacitors 30 are mounted side by side on a horizontal pattern 5*a* of the upper cross-shaped component mounting pattern 5*x*. Similarly, two capacitors 30 are mounted side by side on a horizontal pattern 5a of the lower cross-shaped component mounting pattern 5y.

Connection terminals 32 on two sides of each of the capacitors 30 are mounted to face each other in the vertical direction. The connection terminals 32 are arranged to overlap with corresponding through holes Cx arranged in the vertical direction respectively.

In this manner, the four capacitors 30 are mounted on the two cross-shaped component mounting patterns 5x and 5y arranged inside the cavity C.

In FIG. 24, not only are the insulating wall portions 7a, 7b and 7d arranged between the horizontally adjacent two capacitors 30, but also the insulating wall portions 7c and 7d are arranged between the vertically adjacent two capacitors 30.

Therefore, even in the case where the capacitors 30 are mounted in two rows horizontally and in two columns vertically, the connection terminals 32 of the capacitors 30 can be prevented from touching each other respectively even if the capacitors are inclined or displaced horizontally and vertically.

Figure 25:
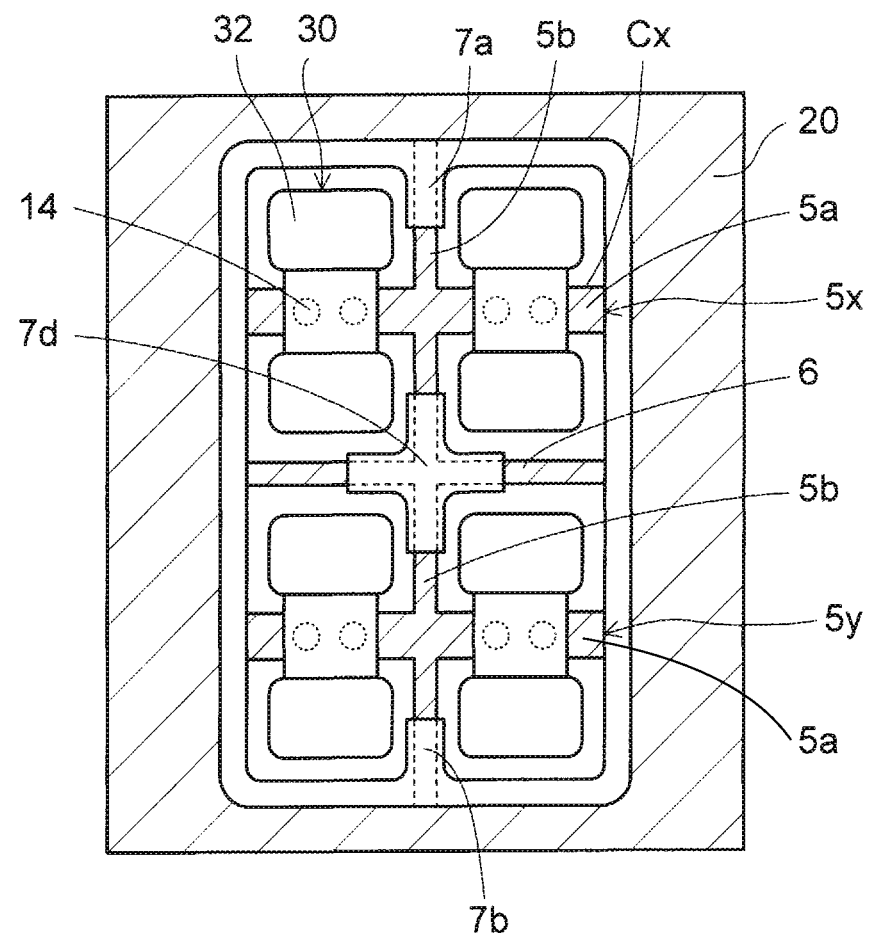
FIG. 25 is a partial plan view illustrating a second example of the case where four capacitors are mounted.

In addition, a second example of the case where four capacitors are mounted is illustrated in FIG. 25. The insulating wall portions 7c which are arranged on the two end sides of the coupling bar 6 in the aforementioned. FIG. 24 may be removed as in FIG. 25.

Figure 26:
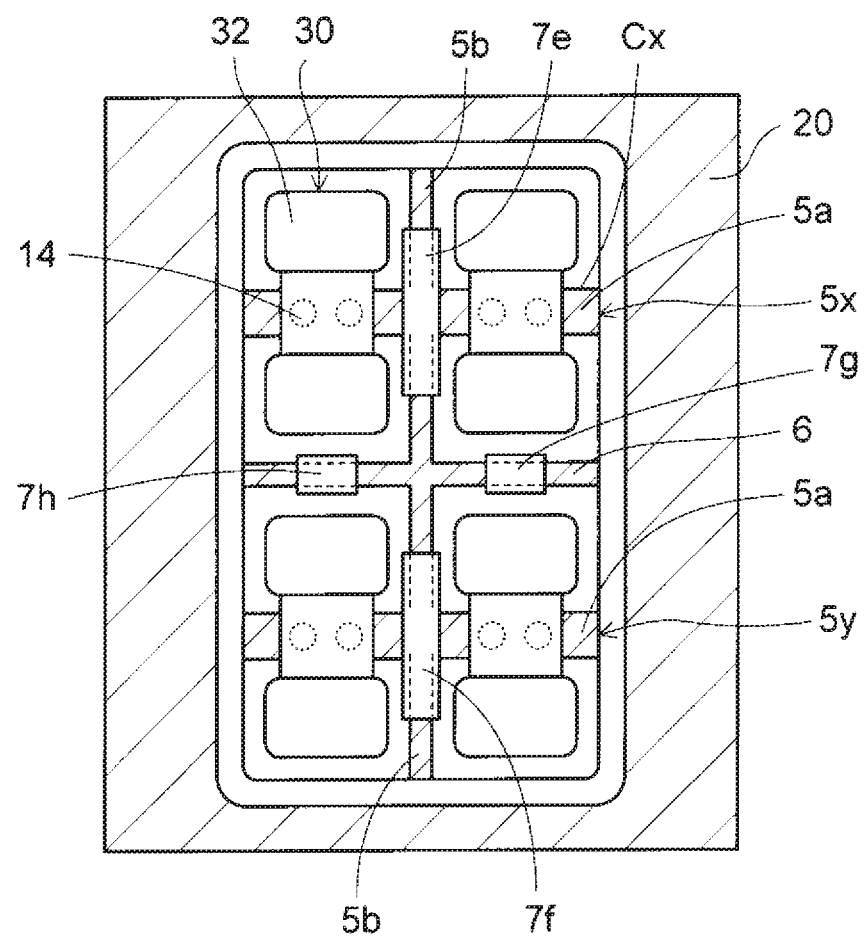
FIG. 26 is a partial plan view illustrating a third example of the case where four capacitors are mounted.

A third example of the case where four capacitors are mounted is illustrated in FIG. 26. As illustrated in FIG. 26, one insulating wall portion 7e is arranged on a central portion of a vertical pattern 5b of an upper cross-shaped component mounting pattern 5x between two capacitors 30.

Similarly, one insulating wall portion 7f is arranged on a central portion of a vertical pattern 5b of a lower cross-shaped component mounting pattern 5y between two capacitors 30.

Each of the insulating wall portions 7e and 7f extends from a center of the vertical pattern 5b to regions between connection terminals 32 of the two capacitors 30. In addition, the insulating wall portion 7e, 7f is arranged separately from the core substrate 10.

Further, an insulating wall portion 7g is arranged on a coupling bar 6 between the connection terminals 32 of the two capacitors 30 which are vertically adjacent to each other in a right column. Similarly, an insulating wall portion 7h is arranged on the coupling bar 6 between the connection terminals 32 of the two capacitors 30 which are vertically adjacent to each other in a left column. Each of the insulating wall portions 7g and 7h is arranged separately from the core substrate 10.

Figure 27:
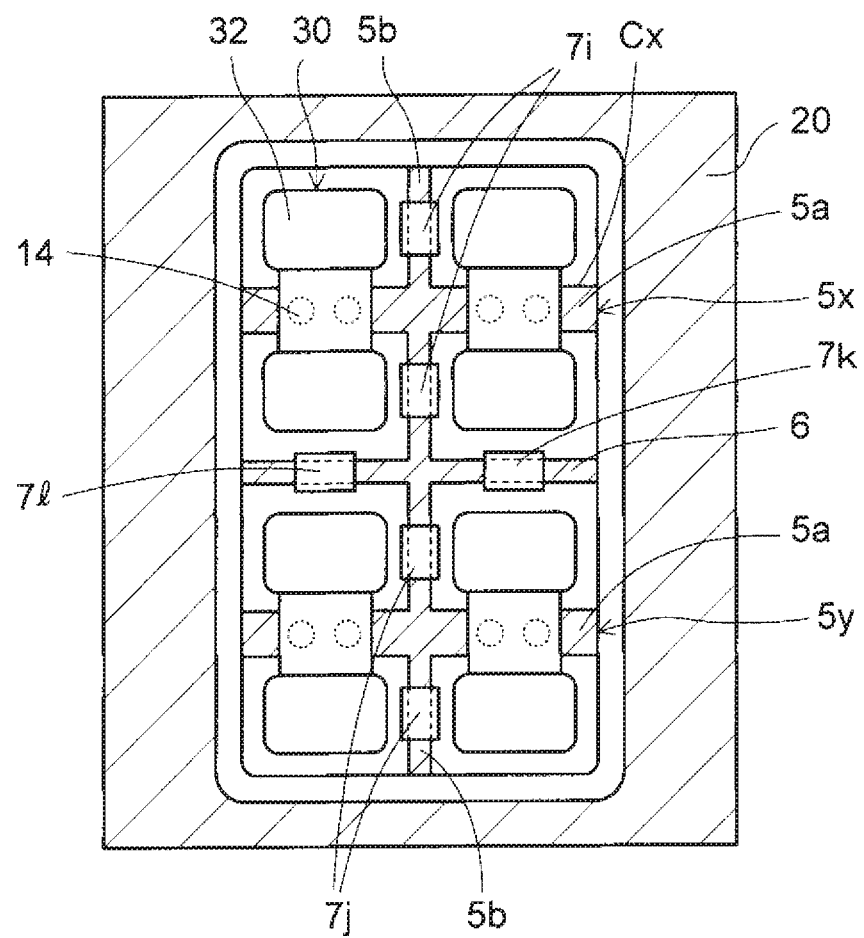
FIG. 27 is a partial plan view illustrating a fourth example of the case where four capacitors are mounted.

In addition, a fourth example of the case where four capacitors are mounted is illustrated in FIG. 27. As illustrated in FIG. 27, two insulating wall portions 7i are arranged separately from each other on a vertical pattern 5b between upper and lower connection terminals 32 of two capacitors 30 which are horizontally adjacent to each other in an upper row.

Similarly, two insulating wall portions 7j are arranged separately from each other on a vertical pattern 5b between upper and lower connection terminals 32 of two capacitors 30 which are horizontally adjacent to each other in a lower row. Each of the insulating wall portions 7i and 7j is arranged separately from the core substrate 10.

In addition, similarly to the aforementioned FIG. 26, an insulating wall portion 7k is arranged on a coupling bar 6 between the connection terminals 32 of the two capacitors 30 which are vertically adjacent to each other in a right column. Moreover, an insulating wall portion 7l is arranged on the coupling bar 6 between the connection terminals 32 of the two capacitors 30 which are vertically adjacent to each other in a left column.

The structures of the second to fourth examples in FIGS. 25 to 27 can obtain similar effects to those obtained by the structure of the first example in FIG. 24.

In addition to the layouts in FIGS. 24 to 27, horizontal patterns 5a and vertical patterns 5b may be intersected each other respectively to thereby construct a latticed component mounting pattern 5.

For example, two component mounting patterns 5x, 5y having the FIG. 24 can be arranged side by side horizontally.

Figure 28:
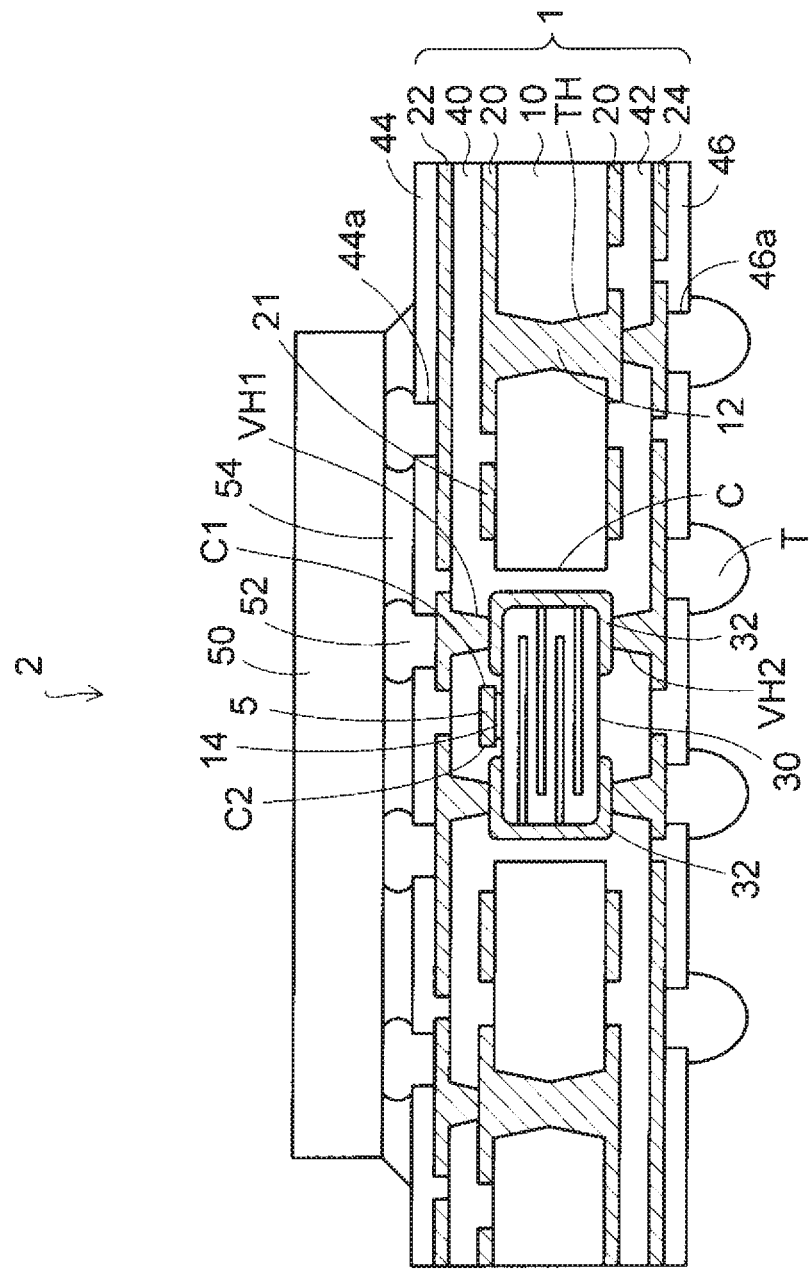
FIG. 28 is a sectional view illustrating an electronic component device according to the embodiment.

An electronic component device 2 including the aforementioned elect component-embedded board 1 in FIG. 18 is illustrated in FIG. 28. As illustrated in FIG. 28, pads of a semiconductor chip 50 are flip-chip connected to the connection portions of the second wiring layer 22 on the upper face side of the aforementioned electronic component-embedded board 1 in FIG. 18 by bump electrodes 52 made of solder etc. in the electronic component device 2 according to the embodiment.

The semiconductor chip 50 is electrically connected to the capacitor 30 through the second wiring layer 22 and the first wiring layer 20.

Further, a space between the electronic component-embedded board 1 and the semiconductor chip 50 is filled with an underfill resin 54. The semiconductor chip 50 is, for example, an LSI chip such as a CPU. The capacitor 30 in the aforementioned electronic component-embedded board 1 is an example of a first electronic component. The semiconductor chip 50 is an example of a second electronic component.

Further, external connection terminals T made of solder balls etc. are provided on the connection portions of the third wiring layer 24 on the lower face side of the electronic component-embedded board 1.

In the electronic component device 2 according to the embodiment, the capacitor 30 embedded in the electronic component-embedded board 1 functions as a decoupling capacitor which is arranged between a power supply line of the semiconductor chip 50 and a ground line. The decoupling capacitor is used to stabilize a voltage of the power supply and reduce high-frequency noise.

As described above, the first through hole C1 and the second through hole C2 are defined on the two sides of the component mounting pattern 5 on which the capacitor 30 is mounted in the electronic component-embedded board 1. Therefore, wiring lines can be connected to the upper faces and the lower faces of the connection terminals 32 of the capacitor 30. Accordingly, the degree of freedom for circuit design of the decoupling capacitor can be improved.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

(1) A method of manufacturing an electronic component-embedded board, the method comprising:

a) preparing a core substrate;

b) forming a wiring layer and a component mounting pattern on one face of the core substrate;

c) forming a cavity penetrating the core substrate such that the component mounting pattern is laid across the cavity to partition the cavity into through holes in plan view;

d) mounting an electronic component on the component mounting pattern and arranging the electronic component inside the cavity; and e) forming a first insulating layer on the one face of the core substrate to cover one face of the electronic component with the first insulating layer, and forming a second insulating layer on the other face of the core substrate to cover the other face of the electronic component with the second insulating layer, such that the cavity is filled with the first insulating layer and the second insulating layer.

(2) The method according to clause (1), wherein in step d), a thickness of the electronic component is thinner than a thickness of the core substrate, the electronic component is fixed to the component mounting pattern by an adhesive agent, and a thickness of the adhesive agent is adjusted to adjust a height position of the electronic component.

(3) The method according to clause (1), wherein the component mounting pattern comprises a vertical pattern and a horizontal pattern perpendicular to the vertical pattern, in step c), an insulating wall portion formed of the same material as the core substrate is formed on the vertical pattern, the electronic component comprises two electronic components, and in step d), the two electronic components are mounted on the horizontal pattern such that the insulating wall portion is arranged between the two electronic components.

What is claimed is:

1. An electronic component-embedded board comprising:
a core substrate;
a cavity which penetrates the core substrate;
a wiring layer formed on one face of the core substrate;
a component mounting pattern formed of the same material as the wiring layer and laid across the cavity to partition the cavity into through holes in plan view;
an electronic component mounted on the component mounting pattern and arranged inside the cavity;
a first insulating layer formed on the one face of the core substrate to cover one face of the electronic component; and
a second insulating layer formed on the other face of the core substrate to cover the other face of the electronic component,
wherein the cavity is filled with the first insulating layer and the second insulating layer, and
a space between a side surface of the electronic component and an inner wall of the core substrate defining the cavity overlaps with the through holes.

2. The electronic component-embedded board according to claim 1, wherein a surface of the component mounting pattern is substantially flush with a surface of the wiring layer.

3. The electronic component-embedded board according to claim 1, wherein a central portion of the electronic component is fixed to the component mounting pattern, and
each of two end sides of the electronic component overlaps with a corresponding one of the through holes in plan view.

4. The electronic component-embedded board according to claim 1, wherein the component mounting pattern is a rectangular strip narrower than an opening width of the cavity.

5. An electronic component-embedded board comprising:
a core substrate;
a cavity which penetrates the core substrate;
a wiring layer formed on one face of the core substrate;
a component mounting pattern formed of the same material as the wiring layer and laid across the cavity to partition the cavity into through holes in plan view;
an electronic component mounted on the component mounting pattern and arranged inside the cavity;
a first insulating layer formed on the one face of the core substrate to cover one face of the electronic component; and
a second insulating layer formed on the other face of the core substrate to cover the other face of the electronic component,
wherein
the cavity is filled with the first insulating layer and the second insulating layer,
the electronic component comprises two electronic components,
the component mounting pattern comprises a vertical pattern and a horizontal pattern perpendicular to the vertical pattern,
the two electronic components are mounted on the horizontal pattern, and
an intersection portion between the vertical pattern and the horizontal pattern is positioned between the two electronic components.

6. The electronic component-embedded board according to claim 1, wherein
a thickness of the electronic component is thinner than a thickness of the core substrate,
the electronic component is fixed to the component mounting pattern by an adhesive agent, and
a height between the one face of the core substrate and the one face of the electronic component is substantially equal to a height between the other face of the core substrate and the other face of the electronic component.

7. The electronic component-embedded board according to claim 5, wherein an insulating wall portion which is formed of the same material as the core substrate is arranged on the vertical pattern between the two electronic components.

8. The electronic component-embedded board according to claim 1, further comprising:
a via conductor which is formed in the first insulating layer to reach an upper face of a connection terminal of the electronic component exposed from one of the through holes; and
another wiring layer formed on an upper face of the first insulating layer and connected to the connection terminal of the electronic component through the via conductor.

9. An electronic component device comprising:
an electronic component-embedded board; and
a second electronic component on the electronic component-embedded board,
wherein the electronic component-embedded board comprises:
a core substrate;
a cavity which penetrates the core substrate;
a wiring layer formed on one face of the core substrate;
a component mounting pattern formed of the same material as the wiring layer and laid across the cavity to partition the cavity into through holes in plan view;

a first electronic component mounted on the component mounting pattern and arranged inside the cavity;

a first insulating layer formed on the one face of the core substrate to cover one face of the first electronic component; and a second insulating layer formed on the other face of the core substrate to cover the other face of the other electronic component, wherein the cavity is filled with the first insulating layer and the second insulating layer, wherein a space between a side surface of the first electronic component and an inner wall of the core substrate defining the cavity overlaps with the through holes, and wherein the second electronic component is electrically connected to the first electronic component.

10. The electronic component-embedded board according to claim 1, wherein the component mounting pattern is a rectangular strip having a horizontal width narrower than horizontal widths of the through holes.

11. The electronic component-embedded board according to claim 1, wherein connection terminals are formed at each longitudinal end of the electronic component, and spaces between side surfaces of the connection terminals and an adjacent inner wall of the core substrate defining the cavity overlap with the through holes in plan view.

* * * * *